(12) United States Patent
Deak et al.

(10) Patent No.: US 10,473,449 B2
(45) Date of Patent: Nov. 12, 2019

(54) SINGLE-CHIP OFF-AXIS MAGNETORESISTIVE Z-X ANGLE SENSOR AND MEASURING INSTRUMENT

(71) Applicant: MultiDimension Technology Co., Ltd., Zhangjiagang (CN)

(72) Inventors: James Geza Deak, Zhangjiagang (CN); Zhimin Zhou, Zhangjiagang (CN)

(73) Assignee: MultiDimension Technology Co., Ltd., Zhangjiagang (CN)

( * ) Notice: Subject to any disclaimer, the term of this patent is extended or adjusted under 35 U.S.C. 154(b) by 439 days.

(21) Appl. No.: 15/505,236

(22) PCT Filed: Aug. 18, 2015

(86) PCT No.: PCT/CN2015/087320
§ 371 (c)(1),
(2) Date: Feb. 20, 2017

(87) PCT Pub. No.: WO2016/026419
PCT Pub. Date: Feb. 25, 2016

(65) Prior Publication Data
US 2017/0268864 A1    Sep. 21, 2017

(30) Foreign Application Priority Data
Aug. 20, 2014    (CN) .......................... 2014 1 0411628

(51) Int. Cl.
*G01R 33/09*  (2006.01)
*G01B 7/30*  (2006.01)
(Continued)

(52) U.S. Cl.
CPC ................. *G01B 7/30* (2013.01); *G01D 5/14* (2013.01); *G01R 33/0011* (2013.01); *G01R 33/093* (2013.01); *G01R 33/098* (2013.01)

(58) Field of Classification Search
CPC . G01B 7/30; G01D 5/14; G01R 33/00; G01R 33/09; G01R 33/098;
(Continued)

(56) References Cited

U.S. PATENT DOCUMENTS

| 2009/0027048 A1* | 1/2009 | Sato .................. B82Y 25/00 324/247 |
| 2011/0068780 A1 | 3/2011 | Sakai |

(Continued)

FOREIGN PATENT DOCUMENTS

| CN | 102297652 | 12/2011 |
| CN | 102298124 A | 12/2011 |

(Continued)

OTHER PUBLICATIONS

"International Application No. PCT/CN2015/087320, International Search Report and Written Opinion dated Nov. 12, 2015", (Nov. 12, 2015), 12 pgs.

*Primary Examiner* — Son T Le
(74) *Attorney, Agent, or Firm* — Schwegman Lundberg & Woessner, P.A.

(57) ABSTRACT

A single-chip off-axis magnetoresistive Z-X angle sensor and measuring instrument. The single-chip off-axis magnetoresistive Z-X angle sensor comprises a substrate located on an X-Y plane, at least one X-axis magnetoresistive sensor and at least one Z-axis magnetoresistive sensor, the X-axis magnetoresistive sensor and the Z-axis magnetoresistive sensor being located on the substrate. The X-axis magnetoresistive sensor and the Z-axis magnetoresistive sensor each comprise magnetoresistive sensing units and a flux concentrator, the magnetoresistive sensing units being electrically connected into a magnetoresistive bridge comprising at least two bridge arms. The Z-axis magnetoresistive sensor is a push-pull bridge structure, a push arm and a pull arm of the push-pull bridge structure being respectively located at (Continued)

positions equidistant from a Y-axis central line of the flux concentrator. The X-axis magnetoresistive sensor is a reference bridge structure, a reference arm and a sensitive arm of the reference bridge structure being respectively located on the Y-axis central line of the flux concentrator and a position more than half of the width of the flux concentrator away from the Y-axis central line. The single-chip off-axis magnetoresistive Z-X angle sensor is placed at an edge of a circular permanent magnet encoding disc and forms an angle measuring instrument. Angle measurement is achieved by measuring X-axis and Z-axis magnetic field components, the structure is compact and sensitivity is high.

31 Claims, 20 Drawing Sheets

(51) Int. Cl.
  *G01R 33/00* (2006.01)
  *G01D 5/14* (2006.01)

(58) Field of Classification Search
  CPC .......... G01R 33/0011; G01R 33/093; G01R 33/095; G01R 33/096; G01R 33/0206; G01R 33/0327; G01R 15/20; G01R 15/205
  See application file for complete search history.

(56) References Cited

U.S. PATENT DOCUMENTS

| | | | | |
|---|---|---|---|---|
| 2013/0099783 A1* | 4/2013 | Kubik | ........... | G01R 33/096 324/252 |
| 2013/0106410 A1* | 5/2013 | Liu | ........... | G01R 33/0029 324/246 |
| 2013/0335073 A1* | 12/2013 | Deak | ........... | B82Y 25/00 324/207.21 |

FOREIGN PATENT DOCUMENTS

| | | |
|---|---|---|
| CN | 102419425 | 4/2012 |
| CN | 104197828 | 12/2014 |
| CN | 204043604 | 12/2014 |
| JP | 2000321014 | 11/2000 |
| WO | WO-2016026419 | 2/2016 |

* cited by examiner

SINGLE-CHIP OFF-AXIS MAGNETORESISTIVE Z-X ANGLE SENSOR AND MEASURING INSTRUMENT

PRIORITY CLAIM TO RELATED APPLICATIONS

This application is a U.S. national stage application filed under 35 U.S.C. § 371 from International Application Serial No. PCT/CN2015/087320, which was filed 18 Aug. 2015, and published as WO2016/026419 on 25 Feb. 2016, and which claims priority to Chinese Application No. 201410411628.0, filed 20 Aug. 2014, which applications and publication are incorporated by reference as if reproduced herein and made a part hereof in their entirety, and the benefit of priority of each of which is claimed herein.

TECHNICAL FIELD

The present invention relates to the field of magnetic sensors, and in particular, to a single-chip off-axis magnetoresistive Z-X angle sensor and an off-axis magnetoresistive Z-X angle measuring instrument based on the sensor.

BACKGROUND ART

A magnetoresistive angle measuring instrument formed by a magnetoresistive angle sensor and a permanent magnet encoding disc is applicable to a magnetic encoder, a rotary position sensor and other fields. Under normal circumstances, for magnetoresistive sensors such as TMRs and GMRs, plane X—Y type magnetoresistive sensor chips are employed, measurement on a rotation angle of the permanent magnet encoding disc is implemented by measuring magnetic field components in X-axis and Y-axis directions and calculating a magnetic field included angle, but it mainly has the following problems:

1) as GMR and TMR magnetoresistive sensing units each have a one-way planar magnetic field sensitive direction, it is common to rotate a sensor slice in an X sensitive direction by 90 degrees to obtain a sensor slice in a Y sensitive direction, the two slices are connected through binding and are packaged in a same chip, but such an X-Y magnetoresistive angle sensor chip affects measurement precision of the sensor because the mounting positions between the slices are related to operations on the slices during packaging, and also has a problem of thread connection between the slices; therefore, the process is relatively complicated;

2) for a bridge structure of a linear X, Y magnetoresistive sensor formed by GMR and TMR magnetoresistive sensor units, when a push-pull structure is employed, it is common to deflect one of the slices formed by two bridge arms by 180 degrees relative to the other to implement opposite magnetic field sensitive directions of a push arm slice and a pull arm slice, the two slices need to be mounted at different positions on the chip, and a connection between the slices is implemented through binding, which may also affect the measurement precision of the sensor, and increase complexity of the process; and 3) for an X-Y angle sensor chip, its working position is located above a position of a rotation plane region parallel to the permanent magnet encoding disc, and thus the mounting space of the permanent magnet encoding disc is smaller than the size of the encoding disc, and it is necessary to increase the size of the encoding disc to ensure that the chip has a large mounting space and a large magnetic field homogenous region.

SUMMARY OF THE INVENTION

With respect to the above problem, a single-chip Z-X magnetoresistive angle sensor is proposed herein, to replace the X-Y magnetoresistive angle sensor, which implements, on a same slice, simultaneous manufacturing of a Z-axis magnetoresistive sensor and an X-axis magnetoresistive sensor, and for the X-axis magnetoresistive sensor, implements design and manufacturing of a reference bridge by employing an enhancing effect of concentrating a magnetic field of a magnetoresistive unit column when a flux concentrator is placed at a position near the magnetoresistive unit column and by employing an attenuating effect of shielding the magnetic field of the magnetoresistive unit column when the flux concentrator covers the magnetoresistive unit column, thus implementing a high-sensitivity X-axis magnetoresistive sensor and at the same time, avoiding a double-slice push-pull structure; for a Z-axis magnetoresistive sensor, forms a push-pull bridge sensor by twisting a Z magnetic field component to have an X-direction magnetic field when the flux concentrator covers a magnetoresistive unit column deviating from a central position of the flux concentrator, converting the Z magnetic field component to magnetic field components along X and −X directions, and measuring the magnetic field components by a magnetoresistive sensor; in addition, the single-chip Z-X magnetoresistive angle sensor is placed at an edge of a circular permanent magnet encoding disc, measurement on a magnetic field rotation angle of the circular permanent magnet encoding disc in a Z-X plane is implemented by measuring X and Z magnetic field components, and there is greater space flexibility relative to placing the X-Y angle sensor above an X-Z plane of the circular permanent magnet encoding disc, all of which successfully solve shortcomings of the X-Y angle sensor.

A single-chip off-axis magnetoresistive Z-X angle sensor proposed in the present invention is used for detecting a magnetic field rotation angle on a plane perpendicular to a substrate surface, and includes:

a substrate located on an X-Y plane;

at least one X-axis magnetoresistive sensor located on the substrate, for detecting an X-axis magnetic field component parallel to the substrate surface; and at least one Z-axis magnetoresistive sensor located on the substrate, for detecting a Z-axis magnetic field component perpendicular to the substrate surface;

the X-axis magnetoresistive sensor and the Z-axis magnetoresistive sensor each include a magnetoresistive sensing unit and a flux concentrator, the flux concentrator is elongated with the major axis being parallel to a Y-axis direction and the minor axis being parallel to an X-axis direction, and a sensitive direction of the magnetoresistive sensing unit is parallel to the X-axis direction;

the magnetoresistive sensing unit of the Z-axis magnetoresistive sensor and the magnetoresistive sensing unit of the X-axis magnetoresistive sensor are each electrically connected into a magnetoresistive bridge including at least two bridge arms, wherein each of the bridge arms is a two-port structure formed by one or more of the magnetoresistive sensing units through electrical connection, and the magnetoresistive sensing units in the bridge arm are arranged into a plurality of magnetoresistive unit columns along a direction parallel to a Y axis;

the magnetoresistive bridge of the Z-axis magnetoresistive sensor is a push-pull bridge, wherein a push arm and a pull arm are located on different sides of a Y-axis central line above or below the flux concentrator in the Z-axis magnetoresistive sensor, respectively, and are equidistant from the Y-axis central line corresponding thereto; and the magnetoresistive bridge of the X-axis magnetoresistive sensor is a reference bridge, wherein a reference arm is located at a position on a Y-axis central line above or below the flux concentrator in the X-axis magnetoresistive sensor, and a sensitive arm is located at a position more than half of the width of the flux concentrator away from the Y-axis central line above or below the flux concentrator in the X-axis magnetoresistive sensor.

Preferably, the flux concentrator is a soft magnetic alloy material containing one or more elements of Ni, Fe, and Co.

Preferably, the magnetoresistive sensing unit is a GMR or TMR magnetoresistive sensing unit.

Preferably, the Z-axis magnetoresistive sensor includes two Z-axis magnetoresistive sensor subunits which are located on two sides of the X-axis magnetoresistive sensor along the X-axis direction, respectively, and the Z-axis magnetoresistive sensor and the X-axis magnetoresistive sensor are corresponding to different flux concentrators, respectively.

Preferably, the X-axis magnetoresistive sensor includes two X-axis magnetoresistive sensor subunits which are located on two sides of the Z-axis magnetoresistive sensor along the X-axis direction, respectively, and the Z-axis magnetoresistive sensor and the X-axis magnetoresistive sensor are corresponding to different flux concentrators, respectively.

Preferably, the X-axis and Z-axis magnetoresistive sensors include a plurality of X-axis magnetoresistive sensor subunits and a plurality of Z-axis magnetoresistive sensor subunits respectively, the X-axis magnetoresistive sensor subunits and the Z-axis magnetoresistive sensor subunits being alternately arranged along the X-axis direction, and the Z-axis magnetoresistive sensor and the X-axis magnetoresistive sensor are corresponding to different flux concentrators, respectively.

Preferably, the Z-axis magnetoresistive sensor and the X-axis magnetoresistive sensor are arranged along the Y-axis direction, and the Z-axis magnetoresistive sensor and the X-axis magnetoresistive sensor are corresponding to different flux concentrators, respectively.

Preferably, the magnetoresistive sensing unit of the Z-axis magnetoresistive sensor and the magnetoresistive sensing unit of the X-axis magnetoresistive sensor are mixedly arranged along the X-axis direction, and the Z-axis magnetoresistive sensor and the X-axis magnetoresistive sensor have a common flux concentrator.

Preferably, the Z-axis magnetoresistive sensor or the Z-axis magnetoresistive sensor subunit includes one flux concentrator, and the magnetoresistive sensing unit is corresponding to the one flux concentrator.

Preferably, the Z-axis magnetoresistive sensor or the Z-axis magnetoresistive sensor subunit includes two flux concentrators, and the push arm and the pull arm are located at positions on different sides of Y-axis central lines of the two flux concentrators, respectively.

Preferably, the Z-axis magnetoresistive sensor or the Z-axis magnetoresistive sensor subunit includes N+2 flux concentrators, and the magnetoresistive sensing unit is corresponding to N flux concentrators in the middle, wherein the N is a positive integer.

Preferably, the X-axis magnetoresistive sensor or the X-axis magnetoresistive sensor subunit includes 2N magnetoresistive unit columns, and a space between two adjacent flux concentrators in the X-axis magnetoresistive sensor is L; when the number of the flux concentrators of the X-axis magnetoresistive sensor is 2N−2, two magnetoresistive unit columns in the middle of the X-axis magnetoresistive sensor are adjacent to each other and corresponding to the reference arm, and a space therebetween is 2L; when the number of the flux concentrators of the X-axis magnetoresistive sensor is 2N−1, two magnetoresistive unit columns in the middle of the X-axis magnetoresistive sensor are corresponding to the sensitive arm and a space therebetween is 2L, wherein the L is a natural number, and the N is an integer greater than 1.

Preferably, the X-axis magnetoresistive sensor or the X-axis magnetoresistive sensor subunit includes 2N magnetoresistive unit columns and 2N−1 flux concentrators, and the magnetoresistive unit columns of the X-axis magnetoresistive sensor are alternately distributed above or below the flux concentrators of the X-axis magnetoresistive sensor and at positions more than half of the width of the flux concentrators of the X-axis magnetoresistive sensor away from the Y-axis central line, wherein the N is a positive integer.

Preferably, when the number of the flux concentrators is 2N+2, the Z-axis magnetoresistive sensor includes 4N magnetoresistive unit columns which are corresponding to 2N flux concentrators in the middle, the X-axis magnetoresistive sensor includes 2N+2 magnetoresistive unit columns, a distance between two magnetoresistive unit columns in the middle of the X-axis magnetoresistive sensor is 4L, and a distance between two adjacent flux concentrators is L, wherein the L is a natural number, and the N is an integer greater than 1.

Preferably, the number of the flux concentrators is 2N+2, the Z-axis magnetoresistive sensor includes 4N magnetoresistive unit columns which are corresponding to 2N flux concentrators in the middle, respectively, the number of the magnetoresistive unit columns included in the X-axis magnetoresistive sensor is 4N, a distance between two magnetoresistive unit columns in the middle of the X-axis magnetoresistive sensor is 2L, and a distance between two adjacent flux concentrators is L, wherein the L is a natural number, and the N is an integer greater than 1.

Preferably, the number of the flux concentrators is N, the number of the magnetoresistive unit columns included in the Z-axis magnetoresistive sensor is 2(N−2) which are corresponding to N−2 flux concentrators in the middle, the number of the magnetoresistive unit columns included in the X-axis magnetoresistive sensor is 2(N−1), and a magnetoresistive unit column is distributed on a Y-axis central line of one of the flux concentrators on one side thereof, wherein the N is an integer greater than 3.

Preferably, the numbers of the magnetoresistive unit columns corresponding to the reference arm and the sensitive arm in the X-axis magnetoresistive sensor are the same, and the numbers of the magnetoresistive unit columns corresponding to the push arm and the pull arm in the Z-axis magnetoresistive sensor are the same.

Preferably, the flux concentrators corresponding to the Z-axis magnetoresistive sensor and the X-axis magnetoresistive sensor have the same width, and also have the same thickness.

Preferably, a magnetic field gain coefficient at a position of a magnetoresistive unit column at a gap between the flux concentrators of the X-axis magnetoresistive sensor is $1 < A_{sns} < 100$, and a magnetic field attenuation coefficient at a position of a magnetoresistive unit column at the Y-axis central line above or below the flux concentrator of the X-axis magnetoresistive sensor is $0 < A_{ref} < 1$.

Preferably, a space L between two adjacent flux concentrators in the Z-axis magnetoresistive sensor is not less than a width Lx of the flux concentrator of the Z-axis magnetoresistive sensor.

Preferably, a space between two adjacent flux concentrators in the Z-axis magnetoresistive sensor is L>2Lx, wherein the Lx is the width of the flux concentrator in the Z-axis magnetoresistive sensor.

Preferably, for the Z-axis magnetoresistive sensor, the smaller a space between the magnetoresistive unit column thereon and an upper edge or a lower edge of the flux concentrator is, or the greater the thickness Lz of the flux concentrator thereon is, or the smaller the width Lx of the flux concentrator thereon is, the higher the sensitivity of the Z-axis magnetoresistive sensor is.

Preferably, the reference bridge of the X-axis magnetoresistive sensor and/or the push-pull bridge of the Z-axis magnetoresistive sensor are/is one of a half bridge structure, a full bridge structure, and a quasi-bridge structure.

Preferably, the magnetoresistive sensing units of the X-axis magnetoresistive sensor and the Z-axis magnetoresistive sensor both have the same magnetic field sensitivity.

In another aspect, the present invention further provides an off-axis magnetoresistive Z-X angle measuring instrument, including the single-chip off-axis magnetoresistive Z-X angle sensor described in the foregoing, wherein the off-axis magnetoresistive Z-X angle measuring instrument further includes a circular permanent magnet encoding disc, a magnetization direction of the circular permanent magnet encoding disc is parallel to a straight line located in a rotation plane of the circular permanent magnet encoding disc and passing through the circle center of the circular permanent magnet encoding disc, a width direction and a rotation axis direction of the circular permanent magnet encoding disc are both along the Y-axis direction, the rotation plane is an X-Z plane, a distance from the X-Y plane where the substrate is located to the edge of the circular permanent magnet encoding disc is Det, and a Z axis passes through the center of the single-chip off-axis Z-X magnetoresistive angle sensor and the axis of the circular permanent magnet encoding disc, wherein the Det>0.

Preferably, the Z-axis magnetoresistive sensor includes two Z-axis magnetoresistive sensor subunits which are located on two sides of the X-axis magnetoresistive sensor along the X-axis direction, respectively, the Z-axis magnetoresistive sensor and the X-axis magnetoresistive sensor are corresponding to different flux concentrators, respectively, the Det is 0.2-0.3 r, and a space between the X-axis magnetoresistive sensor and the Z-axis magnetoresistive sensor subunits is 0-0.3 r, wherein r is the radius of the circular permanent magnet encoding disc.

Preferably, the X-axis magnetoresistive sensor includes two X-axis magnetoresistive sensor subunits which are located on two sides of the Z-axis magnetoresistive sensor along the X-axis direction, respectively, the Z-axis magnetoresistive sensor and the X-axis magnetoresistive sensor are corresponding to different flux concentrators, respectively, the Det is 0.6-0.8 r, and a space between the X-axis magnetoresistive sensor subunits and the Z-axis magnetoresistive sensor is 0.5-0.7 r, wherein r is the radius of the circular permanent magnet encoding disc.

Preferably, the X-axis magnetoresistive sensor and the Z-axis magnetoresistive sensor include a plurality of X-axis magnetoresistive sensor subunits and a plurality of Z-axis magnetoresistive sensor subunits, respectively, the X-axis magnetoresistive sensor subunits and the Z-axis magnetoresistive sensor subunits being alternately arranged along the X-axis direction, the Z-axis magnetoresistive sensor and the X-axis magnetoresistive sensor are corresponding to different flux concentrators, respectively, the Det is 0.5-0.7 r, and a space between the Z-axis magnetoresistive sensor subunit and the X-axis magnetoresistive sensor subunit adjacent to each other is 0.6 r, wherein r is the radius of the circular permanent magnet encoding disc.

Preferably, the Z-axis magnetoresistive sensor and the X-axis magnetoresistive sensor are arranged along the Y-axis direction, the Z-axis magnetoresistive sensor and the X-axis magnetoresistive sensor are corresponding to different flux concentrators, respectively, and the Det is 0.5-0.7 r, wherein r is the radius of the circular permanent magnet encoding disc.

Preferably, the magnetoresistive sensing unit of the Z-axis magnetoresistive sensor and the magnetoresistive sensing unit of the X-axis magnetoresistive sensor are mixedly arranged along the X-axis direction, the Z-axis magnetoresistive sensor and the X-axis magnetoresistive sensor have a common flux concentrator, and the Det is 0.5-0.7 r, wherein r is the radius of the circular permanent magnet encoding disc.

Preferably, the Z-axis magnetoresistive sensor and the X-axis magnetoresistive sensor are arranged along the Y-axis direction, the Z-axis magnetoresistive sensor and the X-axis magnetoresistive sensor have no common flux concentrator, and the single-chip off-axis magnetoresistive Z-X angle sensor is located in an X-axis and Z-axis magnetic field homogeneous region of the circular permanent magnet encoding disc along the width direction of the circular permanent magnet encoding disc.

DETAILED DESCRIPTION

The present invention is described in detail below with reference to the accompanying drawings and in combination with embodiments.

First Embodiment

Figure 1:
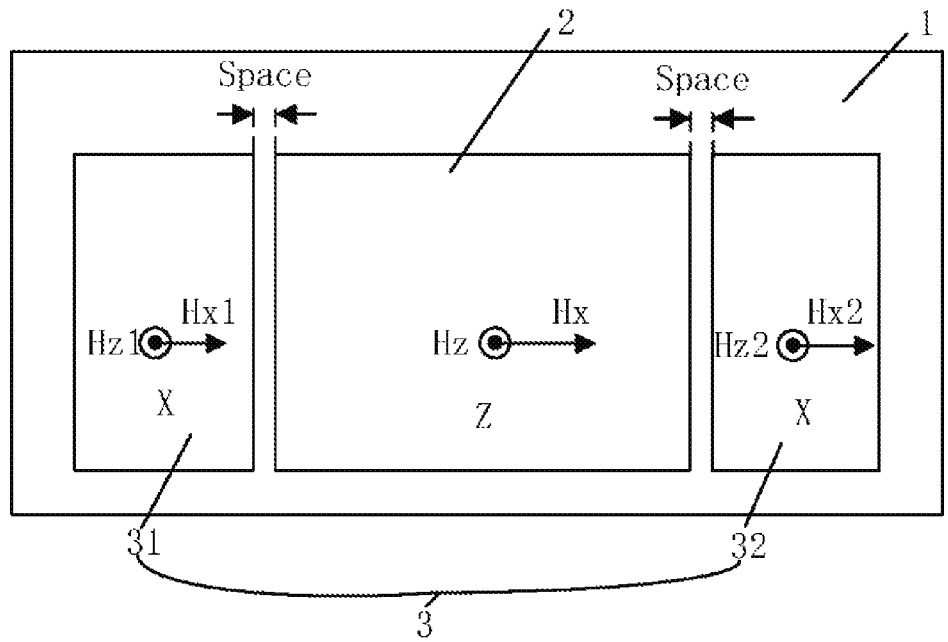
FIG. 1 is a first structure of a single-chip Z-X magnetoresistive angle sensor.

FIG. 1 is a diagram of a first structure of a single-chip magnetoresistive Z-X angle sensor, including a Si substrate 1, and an X-axis magnetoresistive sensor 3 and a Z-axis magnetoresistive sensor 2 which are located on the Si substrate 1, wherein the X-axis magnetoresistive sensor 3 includes two X-axis magnetoresistive sensor subunits 31 and 32 which are arranged on two sides of the Z-axis magnetoresistive sensor 2 along an X-axis direction.

Figure 2:
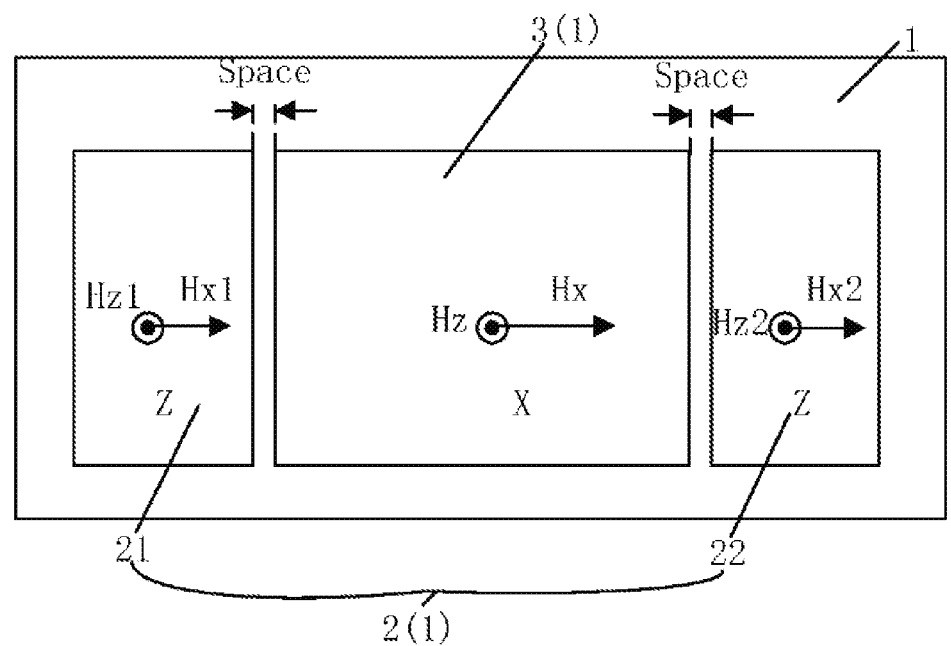
FIG. 2 is a second structure of the single-chip Z-X magnetoresistive angle sensor.

FIG. 2 is a diagram of a second structure of the single-chip magnetoresistive Z-X angle sensor, including a Si substrate 1, and an X-axis magnetoresistive sensor 3(1) and a Z-axis magnetoresistive sensor 2(1) which are located on the Si substrate 1, wherein the Z-axis magnetoresistive sensor 2(1) includes two Z-axis magnetoresistive sensor subunits 21 and 22 which are arranged on two sides of the X-axis magnetoresistive sensor 3(1) along an X-axis direction.

Figure 3:
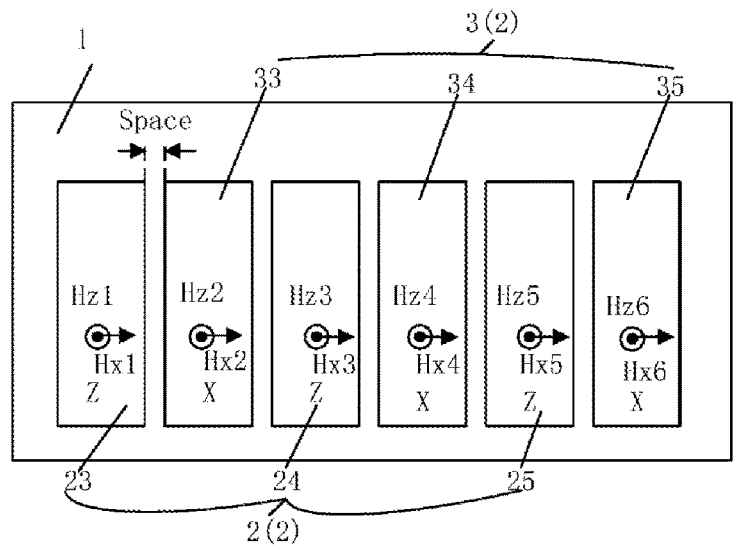
FIG. 3 is a third structure of the single-chip Z-X magnetoresistive angle sensor.

FIG. 3 is a diagram of a third structure of the single-chip magnetoresistive Z-X angle sensor, including a Si substrate 1, and an X-axis magnetoresistive sensor 3(2) and a Z-axis magnetoresistive sensor 2(2) which are located on the Si substrate 1, wherein the Z-axis magnetoresistive sensor 2(2) includes a plurality of Z-axis magnetoresistive sensor subunits 23, 24 and 25, the X-axis magnetoresistive sensor 3(2) includes a plurality of X-axis magnetoresistive sensor subunits 33, 34 and 35, and the X-axis magnetoresistive sensor subunits and the Z-axis magnetoresistive sensor subunits are alternately arranged along an X-axis direction.

Figure 4:
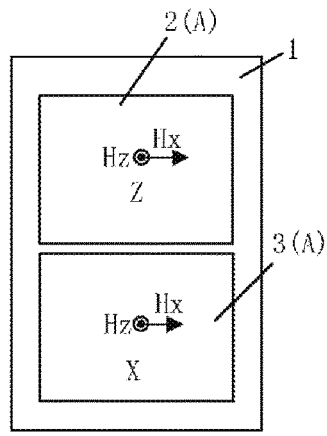
FIG. 4 is a fourth structure of the single-chip Z-X magnetoresistive angle sensor.

FIG. 4 is a diagram of a fourth structure of the single-chip magnetoresistive Z-X angle sensor, including a Si substrate 1, and an X-axis magnetoresistive sensor 3(A) and a Z-axis magnetoresistive sensor 2(A) which are located on the Si substrate 1, wherein the Z-axis magnetoresistive sensor 2(A) and the X-axis magnetoresistive sensor 3(A) are arranged along a Y-axis direction.

Figure 5:
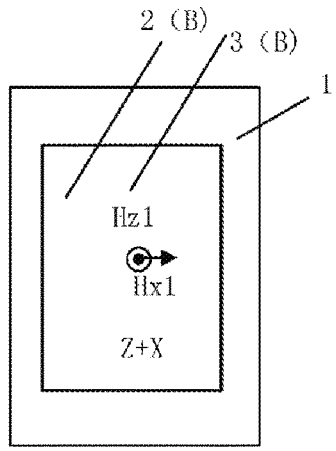
FIG. 5 is a fifth structure of the single-chip Z-X magnetoresistive angle sensor.

FIG. 5 is a diagram of a fifth structure of the single-chip magnetoresistive Z-X angle sensor, including a Si substrate 1, and an X-axis magnetoresistive sensor 3(B) and a Z-axis magnetoresistive sensor 2(B) which are located on the Si substrate 1, and different from the arrangement in FIGS. 1-4, the X-axis magnetoresistive sensor and the Z-axis magnetoresistive sensor have a hybrid structure and are arranged in a same space range.

Second Embodiment

Figure 6:
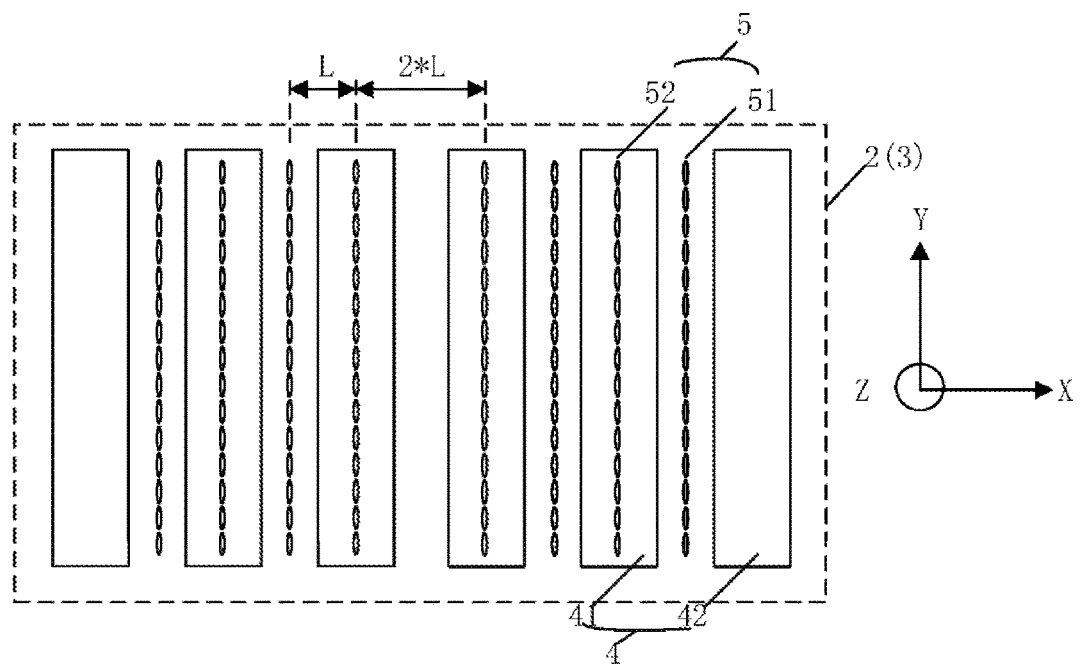
FIG. 6 is a first structure of an X-axis magnetoresistive sensor.

FIG. 6 is a diagram 2(3) of a first structure of an X-axis magnetoresistive sensor and subunits thereof corresponding to the first structure to the fourth structure of the single-chip magnetoresistive Z-X angle sensor, including a flux concentrator 4 and a magnetoresistive unit column 5, wherein the magnetoresistive unit column 5 includes a reference magnetoresistive unit column 52 located at the position of a Y central line above or below the flux concentrator 41 and a sensitive magnetoresistive unit column 51 located at a position more than half of the width of the flux concentrator away from the flux concentrator 41. In the first structure of the X-axis magnetoresistive sensor shown in FIG. 6, a space between two adjacent flux concentrators is L, the X-axis magnetoresistive sensor or the X-axis magnetoresistive sensor subunits include 2N (N is an integer greater than 1) magnetoresistive unit columns, the number of the flux concentrators is an even number 2N−2, two magnetoresistive unit columns in the middle of the X-axis magnetoresistive sensor are adjacent to each other and are corresponding to the reference magnetoresistive unit column, and at a space of 2L.

Figure 7:
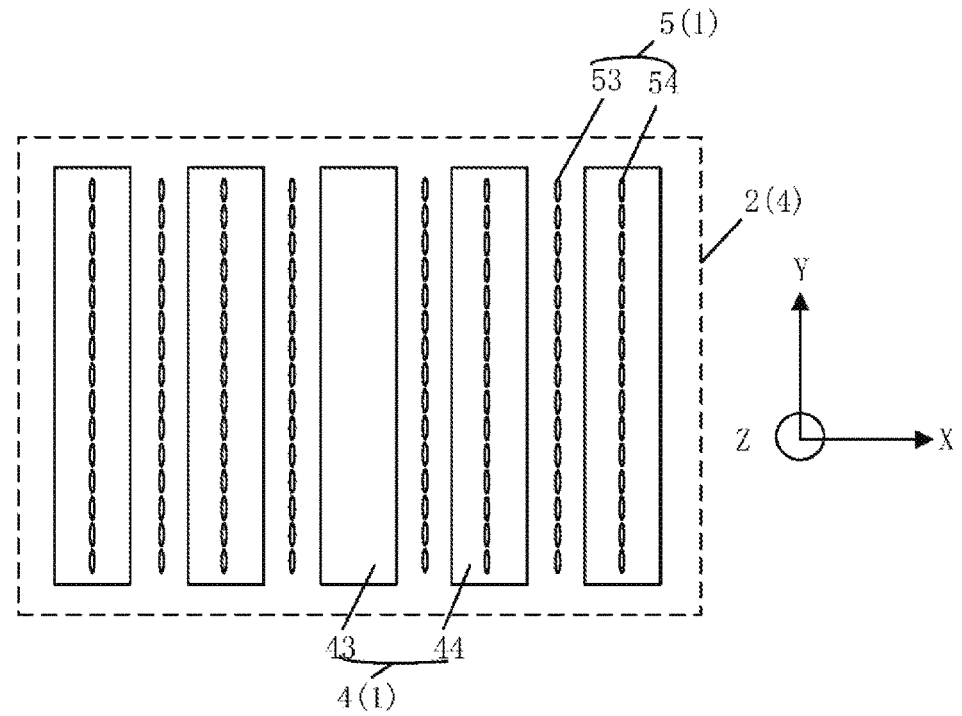
FIG. 7 is a second structure of the X-axis magnetoresistive sensor.

FIG. 7 is a diagram 2(4) of a second structure of an X-axis magnetoresistive sensor and subunits thereof corresponding to the first structure to the fourth structure of the single-chip magnetoresistive Z-X angle sensor, including a flux concentrator 4(1) and a magnetoresistive unit column 5(1), wherein the magnetoresistive unit column 5(1) includes a reference magnetoresistive unit column 54 located at the position of a Y central line above or below the flux concentrator 44 and a sensitive magnetoresistive unit column 53 located at a position more than half of the width of the flux concentrator away from the flux concentrator 44. In the second structure of the X-axis magnetoresistive sensor shown in FIG. 7, a space between two adjacent flux concentrators is L, the X-axis magnetoresistive sensor or the X-axis magnetoresistive sensor subunits include 2N (N is an integer greater than 1) magnetoresistive unit columns, the number of the flux concentrators is an odd number 2N−1, two magnetoresistive unit columns in the middle of the X-axis magnetoresistive sensor are corresponding to the sensitive magnetoresistive unit column, and at a space of 2L, wherein L is a natural number.

Figure 8:
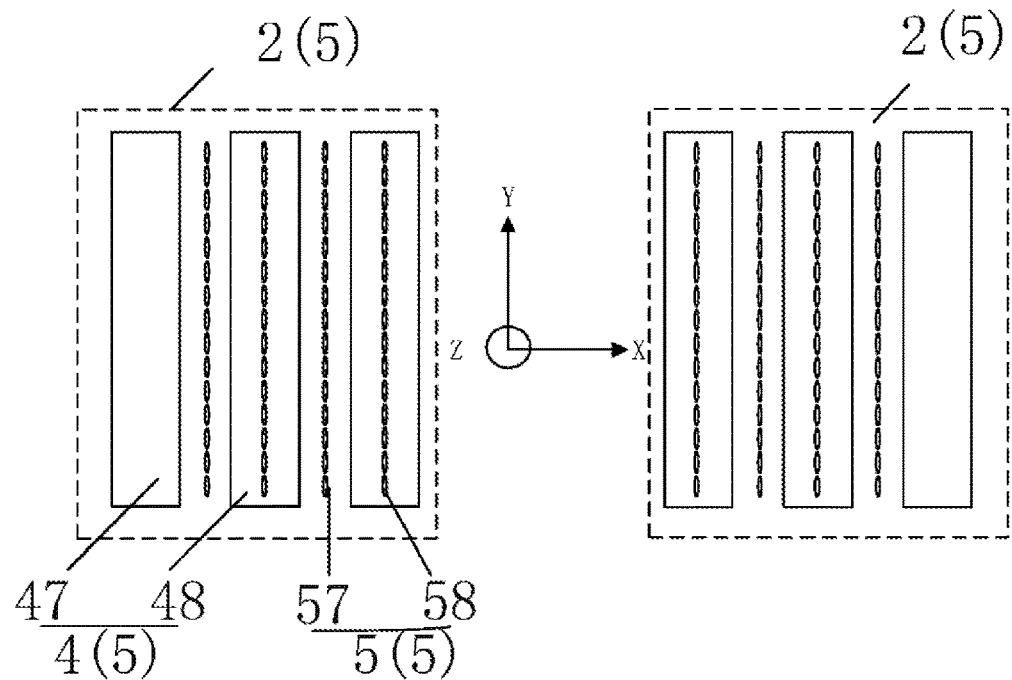
FIG. 8 is a third structure of the X-axis magnetoresistive sensor.

FIG. 8 is a diagram 2(5) of a third structure of an X-axis magnetoresistive sensor and subunits thereof corresponding to the first structure to the fourth structure of the single-chip magnetoresistive Z-X angle sensor, including a flux concentrator 4(5) and a magnetoresistive unit column 5(5), wherein the magnetoresistive unit column 5(5) includes a reference magnetoresistive unit column 58 located at the position of a Y central line on an upper surface or a lower surface of the flux concentrator 4(5) and a sensitive magnetoresistive unit column 57 located at a position more than half of the width of the flux concentrator away from the Y central line of the flux concentrator 4(5), the X-axis magnetoresistive sensor or the X-axis magnetoresistive sensor subunits include 2N (N is an integer greater than 0) magnetoresistive unit columns and 2N−1 flux concentrators, and the magnetoresistive unit columns are alternately distributed on a Y-axis central line above or below the flux concentrator and at a position more than half of the width of the flux concentrator away from the Y-axis central line; therefore, a flux concentrator in the X-axis magnetoresistive sensor or the X-axis magnetoresistive sensor subunits close to positions on two sides in the structure has no reference magnetoresistive unit column.

Third Embodiment

Figure 9:
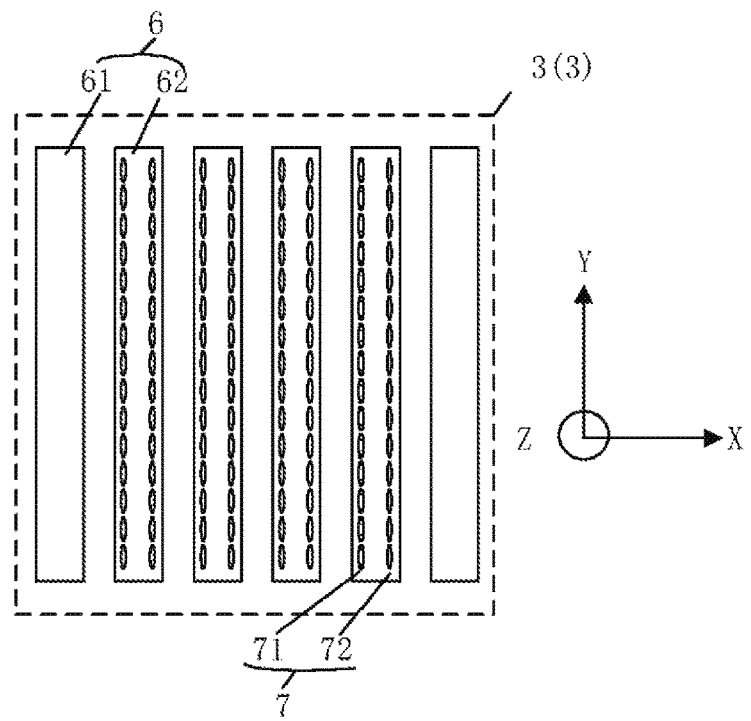
FIG. 9 is a first structure of a Z-axis magnetoresistive sensor.

FIG. 9 is a diagram 3(3) of a first structure of a Z-axis magnetoresistive sensor and Z-axis magnetoresistive sensor subunits thereof corresponding to the first structure to the fourth structure of the single-chip magnetoresistive Z-X angle sensor, including a flux concentrator 6 and a magnetoresistive unit column 7, wherein the magnetoresistive unit column 7 includes a push arm magnetoresistive unit column 71 and a pull arm magnetoresistive unit column 72 in two positions equidistant from a Y central line on two sides of the Y central line on an upper surface or a lower surface of the flux concentrator 6, the Z-axis magnetoresistive sensor or the Z-axis magnetoresistive sensor subunits include N+2 (N is an integer greater than 0) flux concentrators, and the magnetoresistive unit column is corresponding to N flux concentrators in the middle.

Figure 10:
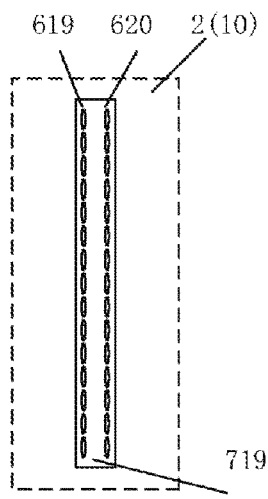
FIG. 10 is a second structure of the Z-axis magnetoresistive sensor.

FIG. 10 is a diagram 3(4) of a second structure of a Z-axis magnetoresistive sensor and Z-axis magnetoresistive sensor subunits thereof corresponding to the first structure to the fourth structure of the single-chip magnetoresistive Z-X angle sensor, including one flux concentrator 719, and magnetoresistive unit columns 619 and 620 corresponding to the flux concentrator 719.

Figure 11:
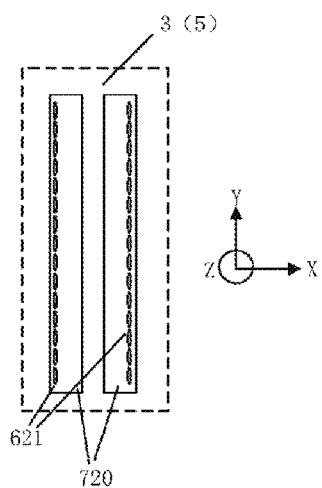
FIG. 11 is a third structure of the Z-axis magnetoresistive sensor.

FIG. 11 is a diagram 3(5) of a third structure of a Z-axis magnetoresistive sensor and Z-axis magnetoresistive sensor subunits thereof corresponding to the first structure to the fourth structure of the single-chip magnetoresistive Z-X angle sensor, including two flux concentrators 720, and two magnetoresistive unit columns 621 corresponding to the two flux concentrators 720 and located at positions on different sides equidistant from a Y-axis central line, for example, the two magnetoresistive unit columns 621 may be located on a left side and a right side of the Y-axis central lines of the two flux concentrators respectively and may also located on a right side and a left side of the Y-axis central lines of the two flux concentrators respectively.

Fourth Embodiment

Figure 12:
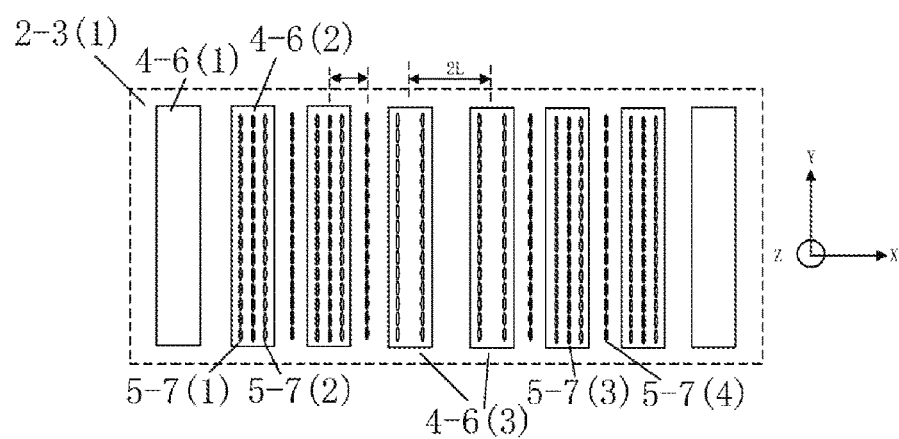
FIG. 12 is a first hybrid structure of the X-axis and Z-axis magnetoresistive sensors.

FIG. 12 is a diagram 2-3(1) of a first hybrid structure of a Z-axis magnetoresistive sensor and an X-axis magnetoresistive sensor corresponding to the fifth structure of the single-chip magnetoresistive Z-X angle sensor, wherein the X-axis magnetoresistive sensor and the Z-axis magnetoresistive sensor have common flux concentrators 4-6(3), 4-6(1) and 4-6(2), and are mixedly arranged corresponding to magnetoresistive sensing units 5-7(3) and 5-7(4) of the X-axis magnetoresistive sensor and magnetoresistive sensing units 5-7(1) and 5-7(2) of the Z-axis magnetoresistive sensor, the number of the corresponding flux concentrators is 2*N+2 (N is an integer greater than 1), the Z-axis magnetoresistive sensor includes 4*N magnetoresistive unit columns which are corresponding to 2N flux concentrators in the middle, the X-axis magnetoresistive sensor includes 2*N+2 magnetoresistive unit columns, a space between two magnetoresistive unit columns in the middle is 4*L, and a space between two adjacent flux concentrators is L.

Figure 13:
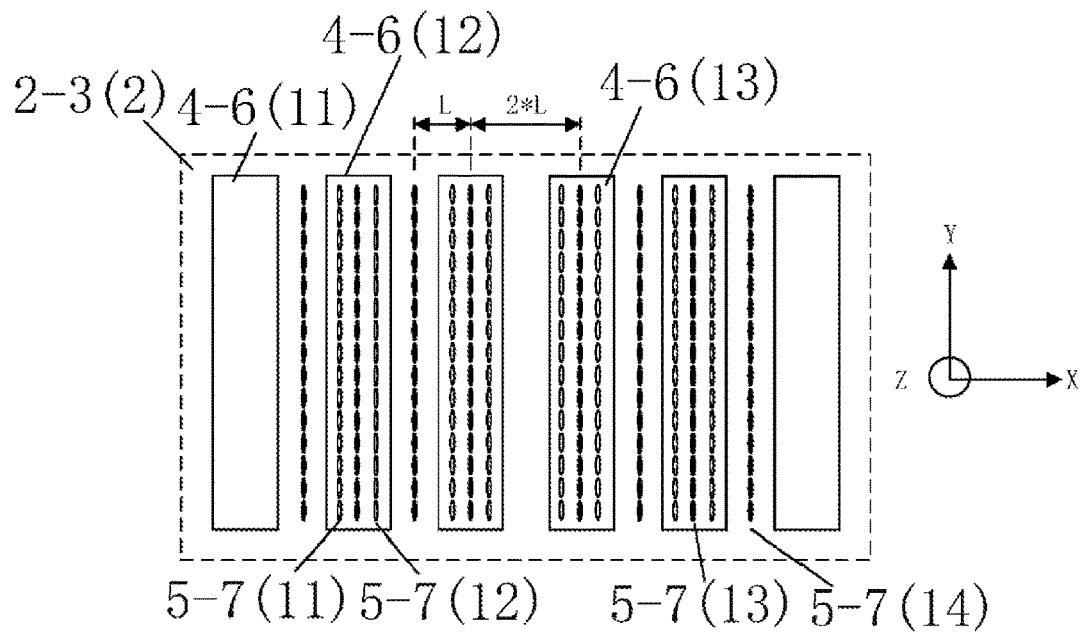
FIG. 13 is a second hybrid structure of the X-axis and Z-axis magnetoresistive sensors.

FIG. 13 is a diagram 2-3(2) of a second hybrid structure of a Z-axis magnetoresistive sensor and an X-axis magnetoresistive sensor corresponding to the fifth structure of the single-chip magnetoresistive Z-X angle sensor, wherein the X-axis magnetoresistive sensor and the Z-axis magnetoresistive sensor have common flux concentrators 4-6(11), 4-6(12) and 4-6(13), and are mixedly arranged corresponding to magnetoresistive sensing units 5-7(13) and 5-7(14) of the X-axis magnetoresistive sensor and magnetoresistive sensing units 5-7(11) and 5-7(12) of the Z-axis magnetoresistive sensor, the number of the flux concentrators is 2*N+2 (N is an integer greater than 1), the Z-axis magnetoresistive sensor includes 4*N magnetoresistive unit columns which are corresponding to 2N flux concentrators in the middle, respectively, the X-axis magnetoresistive sensor includes 4*N magnetoresistive unit columns, a space between two magnetoresistive unit columns in the middle is 2*L, and a space between two adjacent flux concentrators is L.

Figure 14:
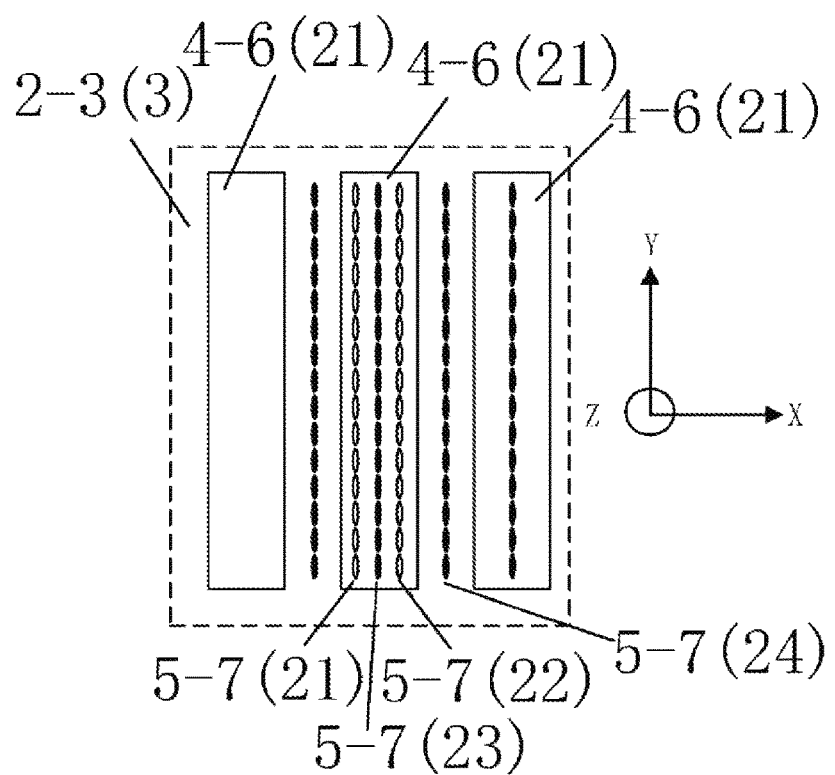
FIG. 14 is a third hybrid structure of the X-axis and Z-axis magnetoresistive sensors.

FIG. 14 is a diagram 2-3(3) of a third hybrid structure of a Z-axis magnetoresistive sensor and an X-axis magnetoresistive sensor corresponding to the fifth structure of the single-chip magnetoresistive Z-X angle sensor, wherein the X-axis magnetoresistive sensor and the Z-axis magnetoresistive sensor have common flux concentrators 4-6(21), 4-6(22) and 4-6(23), and are mixedly arranged corresponding to magnetoresistive sensing units 5-7(23) and 5-7(24) of the X-axis magnetoresistive sensor and magnetoresistive sensing units 5-7(21) and 5-7(22) of the Z-axis magnetoresistive sensor, the number of the flux concentrators is N (N is an integer greater than 3), the Z-axis magnetoresistive sensor includes 2*(N−2) magnetoresistive unit columns which are corresponding to N−2 flux concentrators in the middle, the X-axis magnetoresistive sensor includes 2*(N−1) magnetoresistive unit columns, and the Y-axis central line of one flux concentrator in two flux concentrators on two sides is corresponding to one magnetoresistive unit column.

Fifth Embodiment

Figure 15:
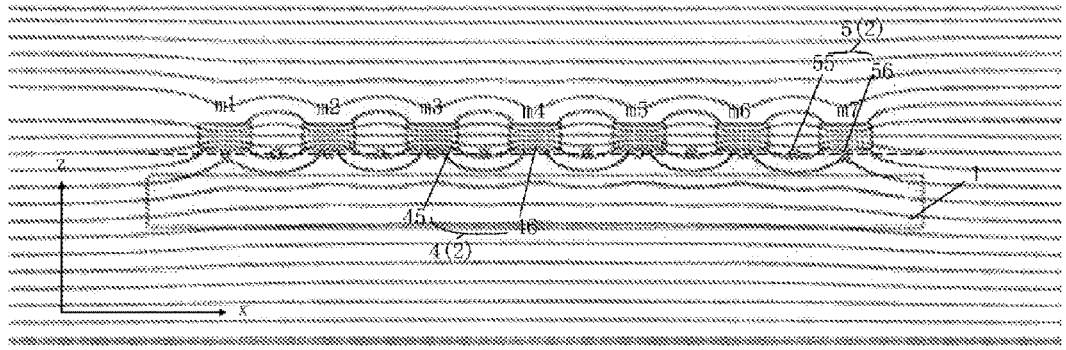
FIG. 15 is a diagram of a measurement principle of an X-axis direction magnetic field of the X-axis magnetoresistive sensor.

FIG. 15 is a diagram of a measurement principle of the X-axis magnetoresistive sensor in an X-axis direction magnetic field, from which it can be seen that, after the X-axis direction magnetic field passes through a flux concentrator 4(2), the magnetic field distribution changes, the density of lines of magnetic force at a corresponding magnetoresistive reference unit column 56 in the center above or below 45 is sparse, indicating that the intensity thereof is reduced, while the density of lines of magnetic force at a magnetoresistive unit column 55 between two adjacent flux concentrators is increased, indicating that the magnetic field intensity thereof is increased.

Figure 16:
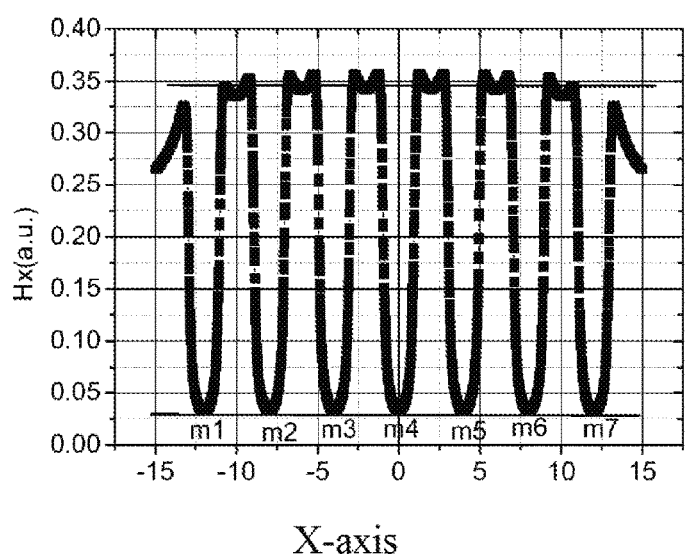
FIG. 16 is a diagram of magnetic field distribution of a magnetoresistive sensor in the X-axis magnetoresistive sensor along an X-axis direction in an X-axis direction external magnetic field.

FIG. 16 is a diagram of intensity distribution of an X-axis direction magnetic field of the X-axis magnetoresistive sensor corresponding to FIG. 15 along an X-axis direction straight line, from which it can be seen that, corresponding to seven flux concentrators m1-m7 in FIG. 15, positions in the center of upper surfaces or lower surfaces of the flux concentrators have extremely small magnetic field intensity, while positions between two adjacent X-flux concentrators have extremely large magnetic field intensity, and minimum magnetic fields at the centers of the upper surfaces or the lower surfaces of the seven X flux concentrators have a same amplitude, and therefore, this means that a magnetoresistive reference unit column may be corresponding to two flux concentrators on two sides, magnetic field amplitudes corresponding to the magnetoresistive sensitive units at adjacent gaps of the seven X flux concentrators are very close, and thus magnetoresistive sensitive unit columns may all be placed in these positions; however, it is apparent that X magnetic field intensity at positions of two sides is evidently less than the magnetic field intensity in the middle position, and thus reference unit columns cannot be placed on outer sides of the m1 and m7 X flux concentrators on two sides.

Figure 17:
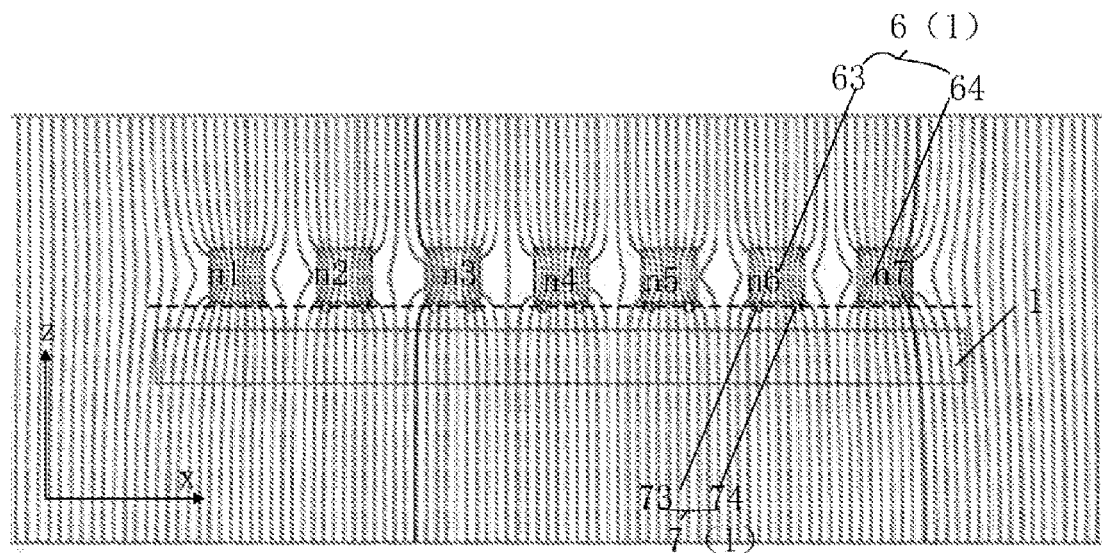
FIG. 17 is a diagram of a measurement principle of a Z-axis direction magnetic field of the Z-axis magnetoresistive sensor.

FIG. 17 is a diagram of a measurement principle of the Z-axis magnetoresistive sensor in a Z-axis direction magnetic field, from which it can be seen that, after the Z-axis direction magnetic field passes through a flux concentrator 6(1), a magnetic field direction nearby changes, at a magnetoresistive sensing unit row of a push arm 73 and a magnetoresistive sensing unit row of a pull arm 74 corresponding to the magnetoresistive unit column 7(1) on two sides of a central line on a lower surface of the flux concentrator, the magnetic field direction is twisted, and a magnetic field component in the X-axis direction appears.

Figure 18:
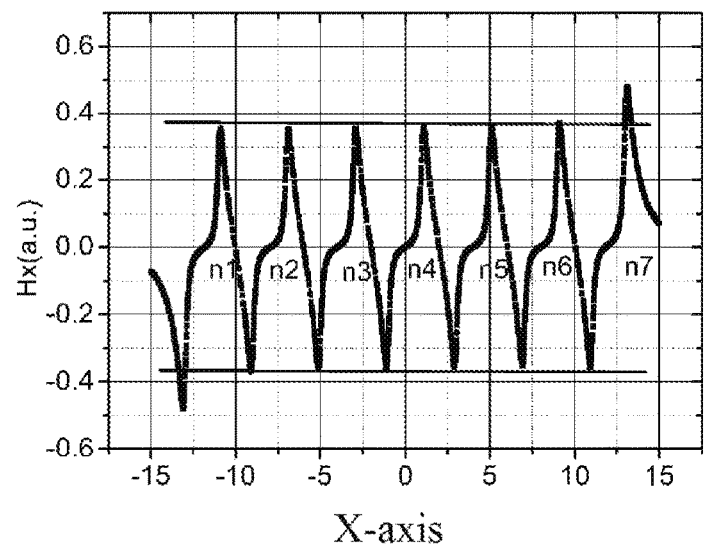
FIG. 18 is a diagram of magnetic field distribution of a magnetoresistive sensor in the Z-axis magnetoresistive sensor along an X-axis direction in a Z-axis direction external magnetic field.

FIG. 18 is a diagram of magnetic field distribution along an X-axis direction at the position of a Z magnetoresistive sensing unit row at the position of the upper surface or a lower surface of the Z-axis flux concentrator 6(1) corresponding to FIG. 17, from which it can be seen that, two sides at positions of central lines of n1-n7 Z flux concentrators have opposite X-axis direction magnetic field components, and the X-axis direction magnetic field components on two sides at the position of the central line corresponding to the Z flux concentrator 63 in the middle are of the same magnitude, while for two Z flux concentrators 64 on two sides, X-axis direction magnetic field components on two sides of their central lines are in opposite directions but of different magnitude; it is apparent that the magnetic field intensity close to the position of the outer side is greater than the magnetic field intensity on the inner side; therefore, Z magnetoresistive sensing unit rows cannot be placed in two Z flux concentrators on two sides.

The above analysis on the magnetic field distribution of the X-axis magnetoresistive sensor and the Z-axis magnetoresistive sensor is consistent with the design of the sensors.

Sixth Embodiment

Figure 19:
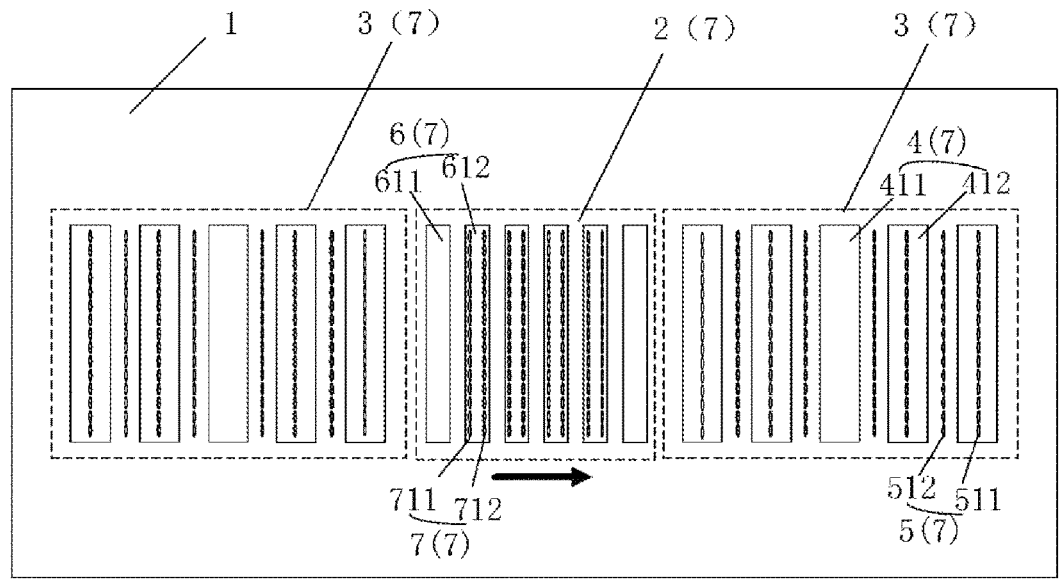
FIG. 19 is a typical topological structure diagram of the first structure of the single-chip Z-X magnetoresistive angle sensor.
Figure 20:
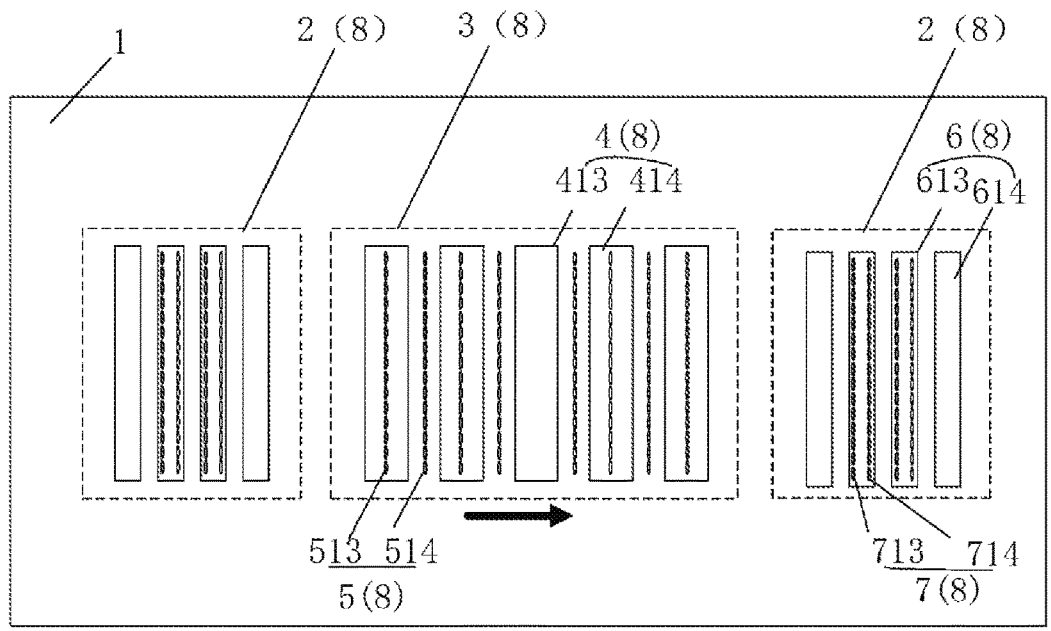
FIG. 20 is a typical topological structure diagram of the second structure of the single-chip Z-X magnetoresistive angle sensor.
Figure 21:
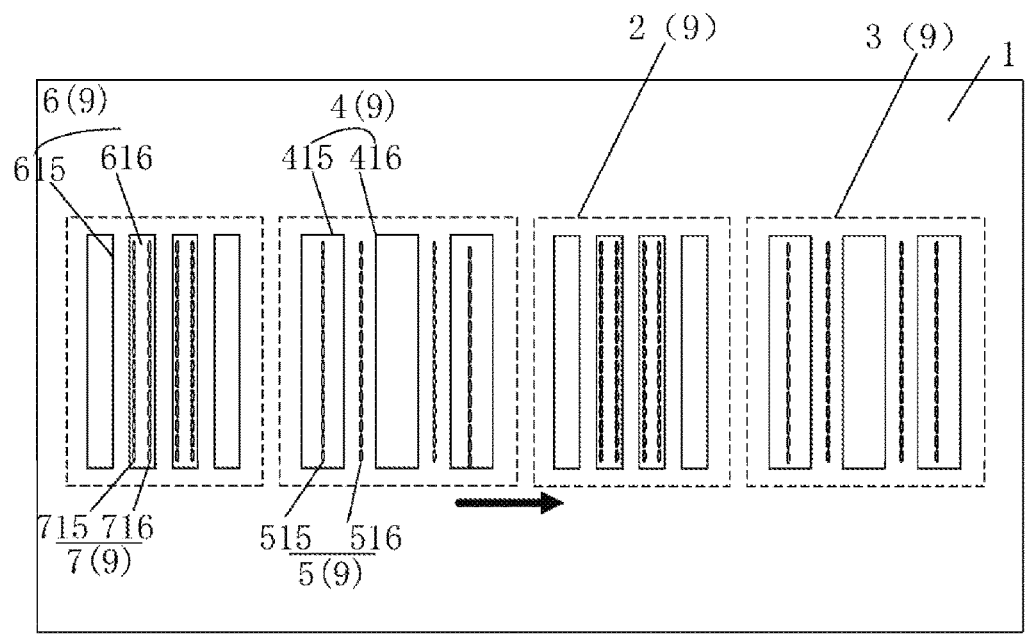
FIG. 21 is a typical topological structure diagram of the third structure of the single-chip Z-X magnetoresistive angle sensor.

FIGS. 19-21 are typical topological structure diagrams of the three structures of the single-chip off-axis magnetoresistive Z-X angle sensor, wherein FIG. 19 is a topological diagram of the single-chip Z-X magnetoresistive angle sensor of the first structure, the Z-axis magnetoresistive sensor 2(7) is of the structure corresponding to FIG. 9 and may also be of the structure shown in FIG. 10 or FIG. 11, while the two X-axis magnetoresistive sensor subunits 3(7) on two sides are of the structure corresponding to FIG. 6 and may also be corresponding to the structure shown in FIG. 7 or FIG. 8. The single-chip off-axis magnetoresistive Z-X angle sensor of the type of the second structure corresponding to FIG. 20 includes two Z-axis magnetoresistive sensor subunits 2(8) of the structure shown in FIG. 9 or FIG. 10 or FIG. 11, and the structure of the X-axis magnetoresistive sensor 3(8) shown in FIG. 6 or FIG. 7 or FIG. 8 in the middle. The single-chip off-axis magnetoresistive Z-X angle sensor corresponding to the type of the third structure in FIG. 21 includes an alternate combination of a Z-axis magnetoresistive sensor and an X-axis magnetoresistive sensor, wherein the Z-axis magnetoresistive sensor subunit 2(9) is of the structure shown in one of FIGS. 9-11, and the X-axis magnetoresistive sensor subunit 3(9) may be any of the structures shown in FIGS. 6-8.

Seventh Embodiment

Figure 22:
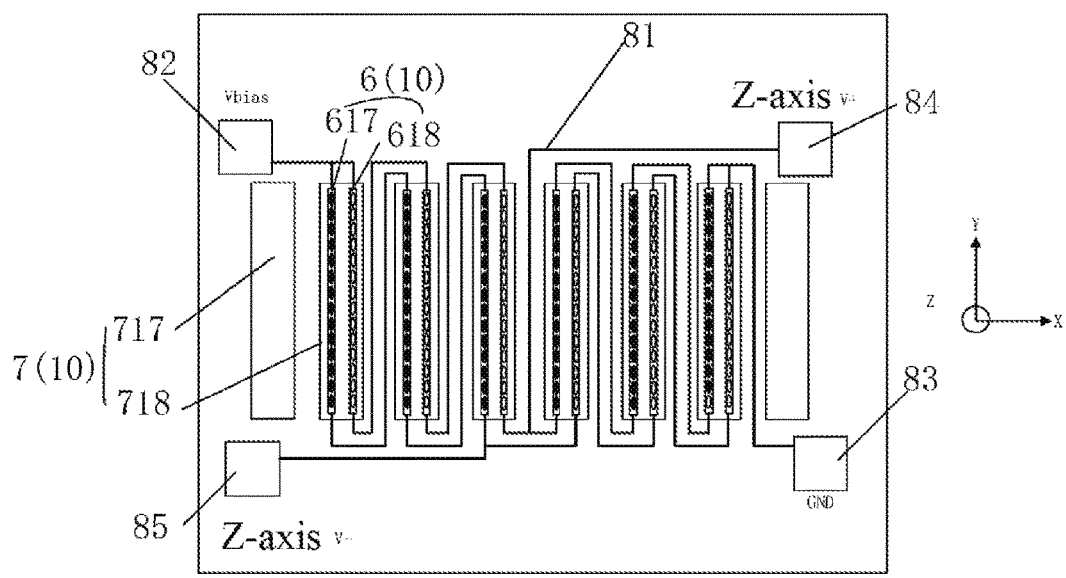
FIG. 22 is a diagram of an electrical connection of a Z-axis magnetoresistive sensor of a full bridge structure.
Figure 23:
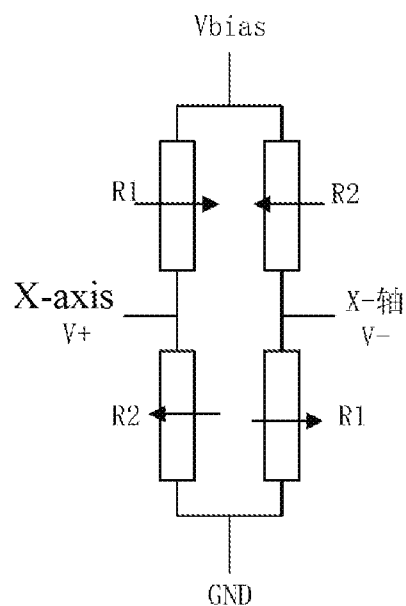
FIG. 23 is a brief diagram of the Z-axis magnetoresistive sensor of a full bridge structure.

FIG. 22 is a structural diagram of the Z-axis magnetoresistive sensor corresponding to the single-chip off-axis magnetoresistive Z-X angle sensor, and FIG. 23 is a diagram of electrical connection corresponding to the Z-axis magnetoresistive sensor. The magnetoresistive sensing units are electrically connected into a push-pull bridge structure including at least two arms, each bridge arm includes a two-port structure formed by connecting one or more magnetoresistive sensing units, and the magnetoresistive sensing units are arranged into a plurality of magnetoresistive unit columns. A full-bridge push-pull structure is shown in this figure, including a power supply input terminal 82, a ground input terminal 83, two signal output terminals 84 and 85, flux concentrators 717 on two sides, and a flux concentrator 718 in the middle, wherein push arm and pull arm magnetoresistive unit columns 617 and 618 are located on two sides deviating from the central line below the flux concentrator 718 in the middle, respectively, and are connected through an electrical connection line 81, and a full bridge structure corresponding thereto is as shown in FIG. 18.

Figure 24:
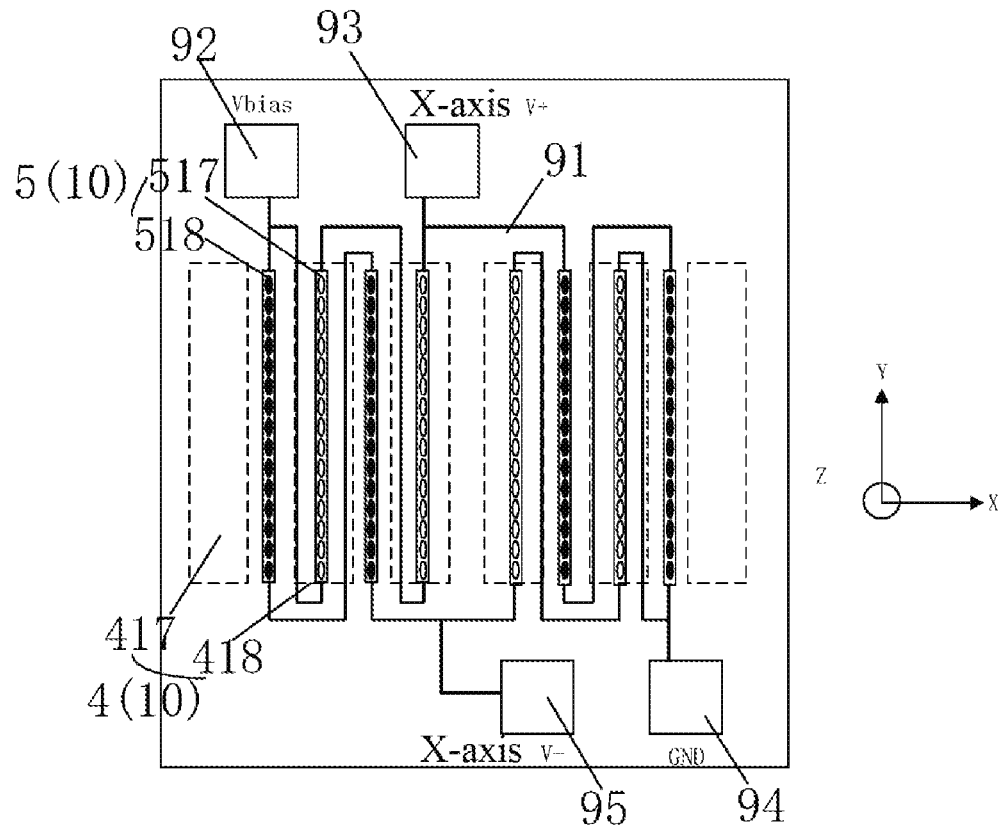
FIG. 24 is a diagram of an electrical connection of an X-axis magnetoresistive sensor of a full bridge structure.
Figure 25:
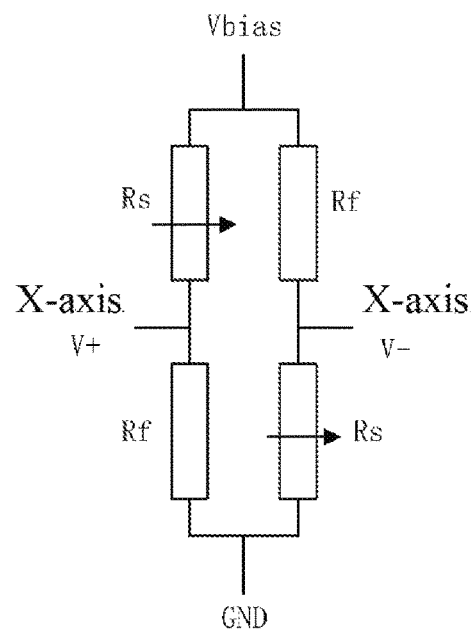
FIG. 25 is a brief diagram of the X-axis magnetoresistive sensor of a full bridge structure.

FIG. 24 is a structural diagram of an electrical connection corresponding to the X-axis magnetoresistive sensor. The magnetoresistive sensing units are electrically connected into a reference bridge including at least two arms, each bridge arm includes a two-port structure formed by connecting one or more magnetoresistive sensing units, and the magnetoresistive sensing units are arranged into a plurality of magnetoresistive unit columns. A reference full-bridge structure is shown in this figure, including a power supply input terminal 92, a ground terminal 94, signal output terminals 93 and 95, a reference magnetoresistive unit column 517 in the central position of the flux concentrator, an X magnetoresistive sensitive unit column 518 between two adjacent flux concentrators, and an electrical connection conductor 91; a reference full-bridge structure corresponding thereto is as shown in FIG. 25.

It should be noted that the above is a situation where the X-axis magnetoresistive sensor and the Z-axis magnetoresistive sensor are not provided with a plurality of subunits, and for a situation where there are a plurality of subunits in the first structure, the second structure and the third structure, it is necessary to employ a conductive unit to be connected between different subunits, thus finally forming an X-axis or Z-axis magnetoresistive sensor structure.

It should be noted that the above provides a full-bridge structure; in fact, either the X-axis magnetoresistive sensor or the Z-axis magnetoresistive sensor may be further electrically connected into a half bridge or quasi-bridge structure including a magnetoresistive reference unit column and a magnetoresistive sensitive unit column as well as a push arm and a pull arm.

Figure 26:
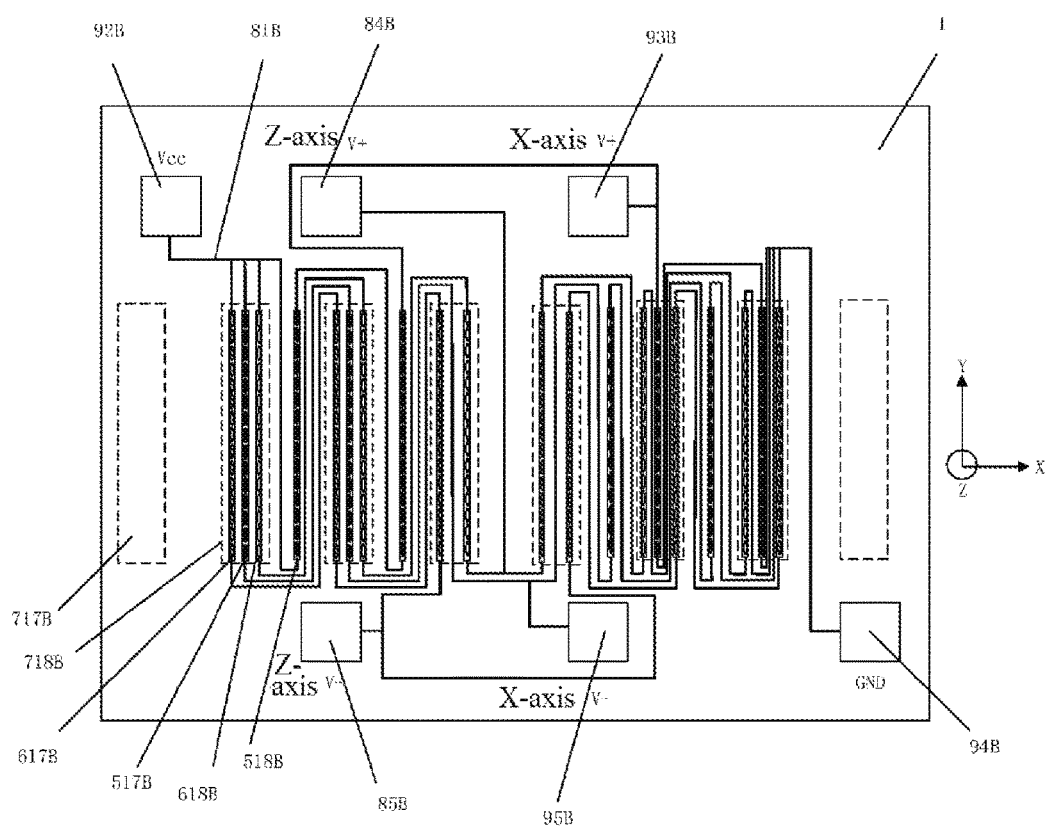
FIG. 26 is a first diagram of an electrical connection of an X-axis and Z-axis hybrid structure sensor of a full bridge structure.
Figure 27:
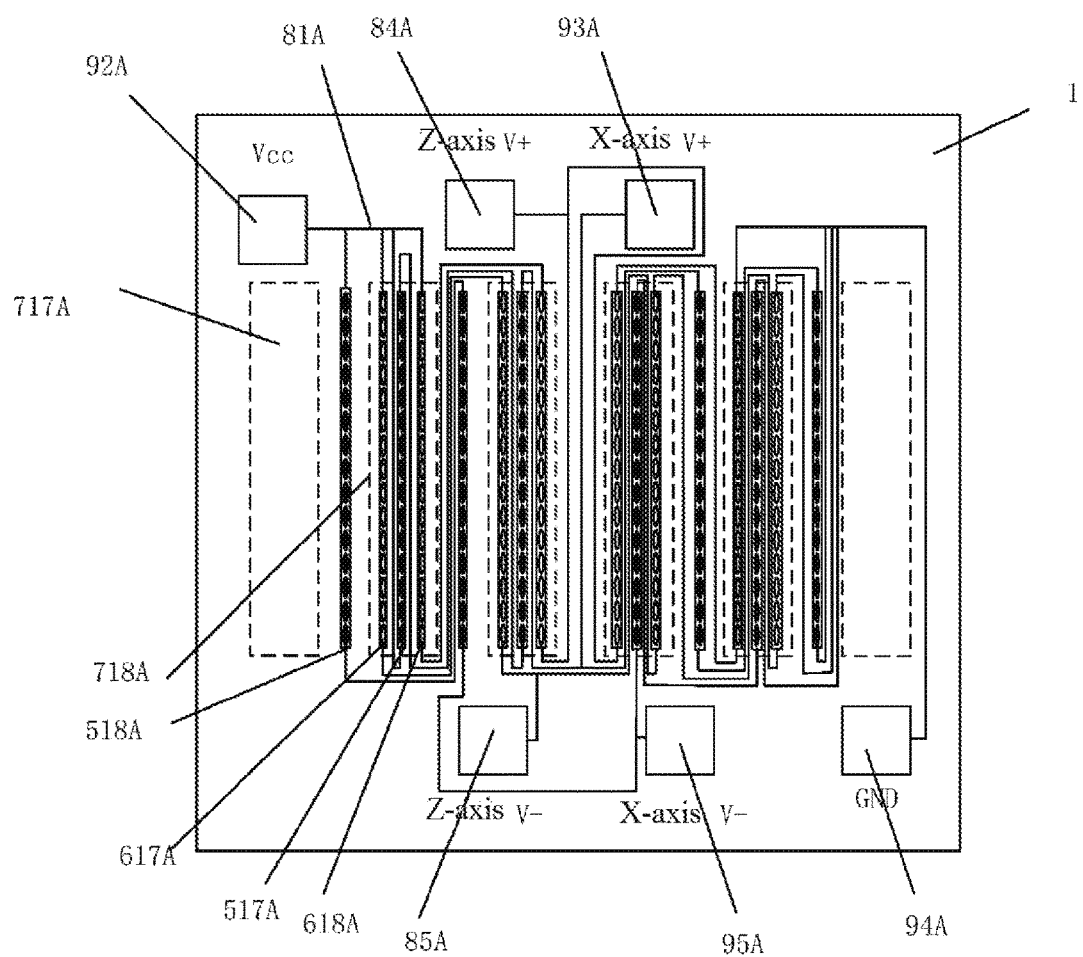
FIG. 27 is a second diagram of an electrical connection of the X-axis and Z-axis hybrid structure sensor of a full bridge structure.
Figure 28:
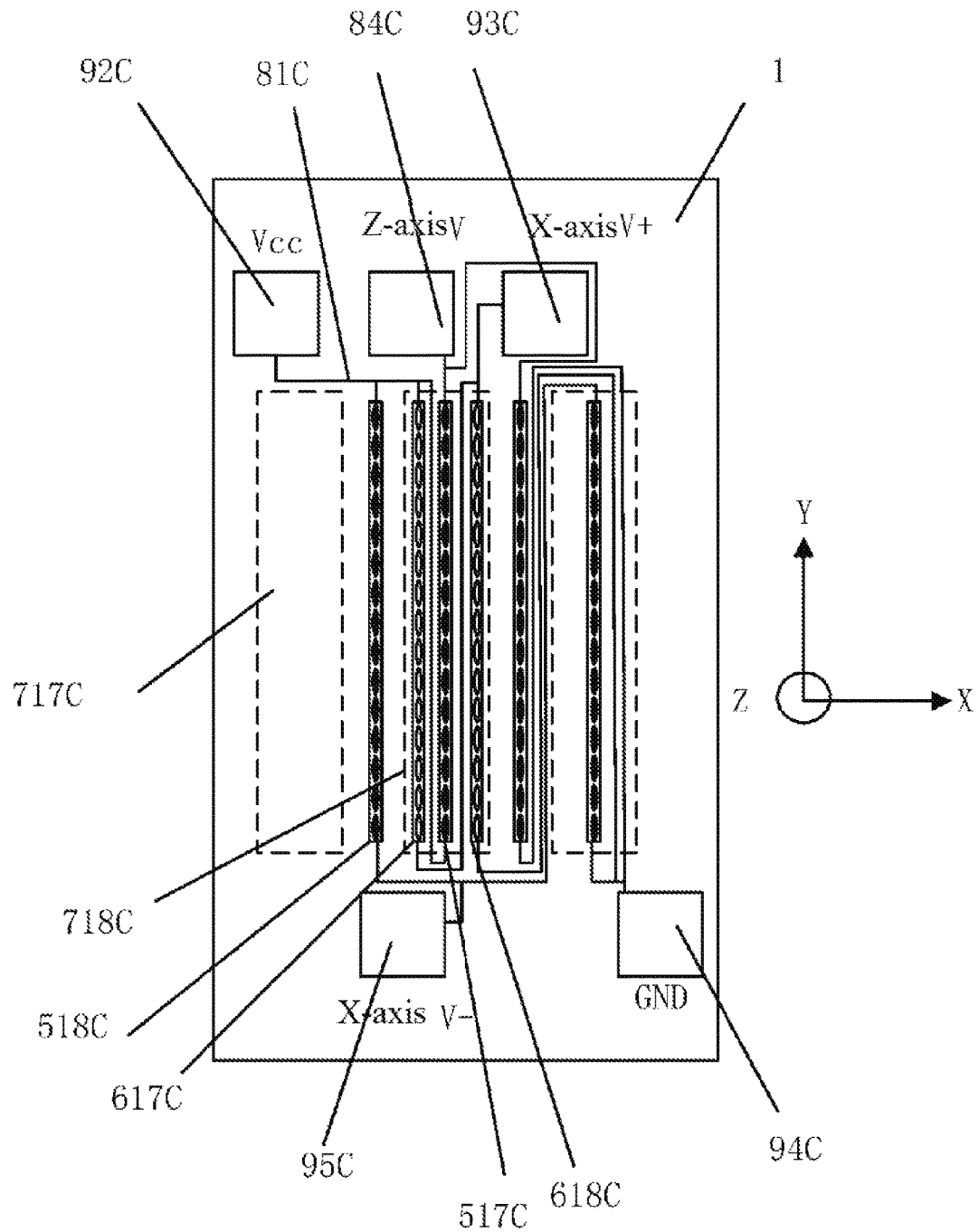
FIG. 28 is a third diagram of an electrical connection of the X-axis and Z-axis hybrid structure sensor of a full bridge structure.

FIGS. 26-28 are diagrams of electrical connections of magnetoresistive sensing units corresponding to a hybrid structure of the X-axis magnetoresistive sensor and the Z-axis magnetoresistive sensor, respectively. In FIGS. 26, 92B and 94B are corresponding to power supply and ground terminals of the X-axis magnetoresistive sensor and the Z-axis magnetoresistive sensor, respectively. As the X-axis magnetoresistive sensor and the Z-axis magnetoresistive sensor in the structure are both of a full-bridge structure, 84B and 85B are corresponding to two signal output terminals of the Z-axis magnetoresistive sensor, respectively, and 93B and 95B are corresponding to two signal output terminals of the X-axis magnetoresistive sensor, respectively, 81B is a connecting wire, 718B is a flux concentrator at an edge, 718B is a flux concentrator in the middle position, for the X-axis magnetoresistive sensor, 517B and 518B are corresponding to the reference magnetoresistive unit column and the sensitive magnetoresistive unit column of the X-axis magnetoresistive sensor, respectively, and for the Z-axis magnetoresistive sensor, 617B and 618B are corresponding to two push arm and pull arm magnetoresistive unit columns thereof, respectively.

In FIGS. 27, 92A and 94A are corresponding to power supply and ground input terminals of the X-axis magnetoresistive sensor and the Z-axis magnetoresistive sensor, respectively. Similarly, as the X-axis magnetoresistive sensor and the Z-axis magnetoresistive sensor in the structure are both of a full-bridge structure, 84A and 85A are corresponding to two signal output terminals of the Z-axis magnetoresistive sensor, respectively, and 93A and 95A are corresponding to two signal output terminals of the X-axis magnetoresistive sensor, respectively, 717A is a flux concentrator at an edge, 718A is a flux concentrator in the middle position, and for the X-axis magnetoresistive sensor, 518A is a sensitive magnetoresistive unit column, 517A is a reference magnetoresistive unit column, and 617A and 618A are magnetoresistive unit columns corresponding to the push arm and the pull arm.

In FIGS. 28, 92C and 94C are power supply and ground input terminals of the X-axis magnetoresistive sensor and the Z-axis magnetoresistive sensor, respectively. In the structure, the Z-axis magnetoresistive sensor is a half bridge, and thus there is only one output signal terminal 84C, the X-axis magnetoresistive sensor is a full bridge, 93C and 95C are two signal output terminals thereof, 81C is a corresponding middle connecting wire, 717C is a flux concentrator at an edge, 718C is a flux concentrator in the middle position, 518C and 517C are corresponding to a sensitive magnetoresistive unit column and a reference magnetoresistive unit column, respectively, and 617C and 618C are corresponding to magnetoresistive unit columns of the push arm and the pull arm, respectively.

In FIGS. 26-28, it can be seen that, in order to effectively connect the magnetoresistive unit columns of the X-axis and Z-axis magnetoresistive sensors and avoid crossing, the wire, the output terminal, and the input terminal are arranged, and the wire bypasses the output terminal and the input terminal.

Eighth Embodiment

Figure 29:
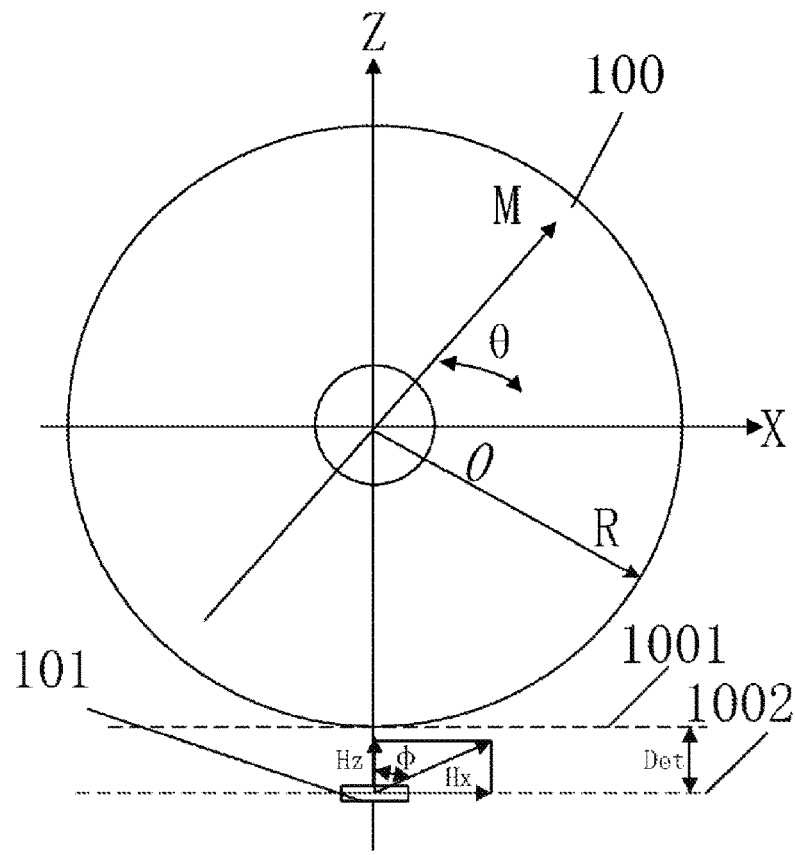
FIG. 29 is a schematic diagram of angular measurement of a single-ship X-Z magnetoresistive angle sensor+a circular permanent magnet encoding disc.

FIG. 29 is a situation where a single-chip off-axis magnetoresistive Z-X sensor 101 is applied to angular measurement, including a circular permanent magnet encoding disc 100, which may rotate along a central axis, and an axis direction and a width direction thereof are a Y-axis direction. A magnetization direction M thereof is a one-way direction passing through the diameter, the single-chip off-axis magnetoresistive Z-X sensor 101 is located on a measuring plane 1002 which is at an edge of the permanent magnet encoding disc 100 and parallel to a tangent plane 1001 of the permanent magnet encoding disc, meanwhile, a substrate thereof is also located on an XY plane, a connecting line between the center of a chip thereof and the center of the encoding disc is perpendicular to the chip and passes through the Z-axis direction, a distance from the center of the chip 101 to the edge of the permanent magnet encoding disc 100 is Det, the X-axis direction is parallel to a rotation speed direction of the permanent magnet encoding disc on the tangent plane, and the Z axis is the normal direction of the chip, wherein an angle between the magnetization direction of the permanent magnet encoding disc 100 and the Z axis is defined as a rotation angle θ, and Z-axis direction magnetic field components and X-axis direction magnetic field components generated by the permanent magnet encoding disc 100 at the Z-axis and X-axis magnetoresistive sensors and subunits thereof at the single-chip off-axis magnetoresistive Z-X sensor 101 are as shown in FIGS. 1, 2 and 3; suppose that a magnetic field at each position i is (Hxi, Hzi), for the chip 101, an average sensor magnetic field included angle φ is formed, and φ of the single-chip off-axis magnetoresistive Z-X angle sensor of the three structures is calculated as follows:

For the first structure, as shown in FIG. 1, magnetic fields at positions of the X-axis and Z-axis magnetoresistive sensors and subunits thereof from left to right are 1: H1(Hx1, Hz1), 2: H2 (Hx, Hz), and 3: (Hx2, Hz2), respectively, and therefore:

$$\varphi = a\tan((Hx1+Hx2)/Hz), HZ>0$$

$$\varphi = a\tan((Hx1+Hx2)/Hz)-Pi, HZ<0; Hx1+Hx2<0$$

$$\varphi = a\tan((Hx1+Hx2)/Hz)+Pi, HZ<0; Hx1+Hx2>0$$

In a situation that the sensitivity is determined, the output signals of the Z-axis and X-axis magnetoresistive sensors are only directly proportional to the magnetic field signals, and at this point, the magnetic field signals of the Z-axis and X-axis magnetoresistive sensors are respectively:

Z: Hz
X: Hx1+Hx2

For the second structure, as shown in FIG. 2, $$\varphi = a\tan((Hx/(Hz1+Hz2)), Hz1+Hz2>0$$

$$\varphi = a\tan((Hx/(Hz1+Hz2))-Pi, Hz1+Hz2<0, Hx<0$$

$$\varphi = a\tan((Hx/(Hz1+Hz2))+Pi, Hz1+Hz2<0, Hx>0$$

At this point, the magnetic field signals of the Z-axis and X-axis magnetoresistive sensors are respectively:

Z: Hz1+Hz2
X: Hx

For the third structure to the fifth structure, as shown in FIGS. 3-5, $$\varphi = a\tan(\Sigma Hxi/\Sigma Hzi); \Sigma Hzi>0$$

$$\varphi = a\tan(\Sigma Hxi/\Sigma Hzi)-Pi; \Sigma Hzi<0, \Sigma Hxi<0$$

$$\varphi = a\tan(\Sigma Hxi/\Sigma Hzi)+Pi; \Sigma Hzi>0, \Sigma Hxi>0$$

At this point, the magnetic field signals of the Z-axis and X-axis magnetoresistive sensors are respectively:

Z: ΣHzi
X: ΣHxi

Figure 30:
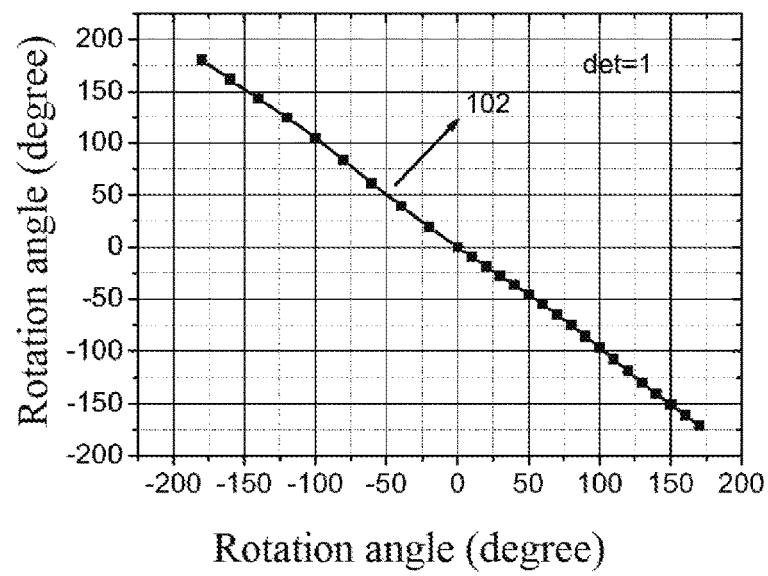
FIG. 30 is a typical relation diagram of an average magnetic field measuring angle and a rotation angle of the permanent magnet encoding disc in the first structure of the single-chip Z-X magnetoresistive angle sensor.
Figure 31:
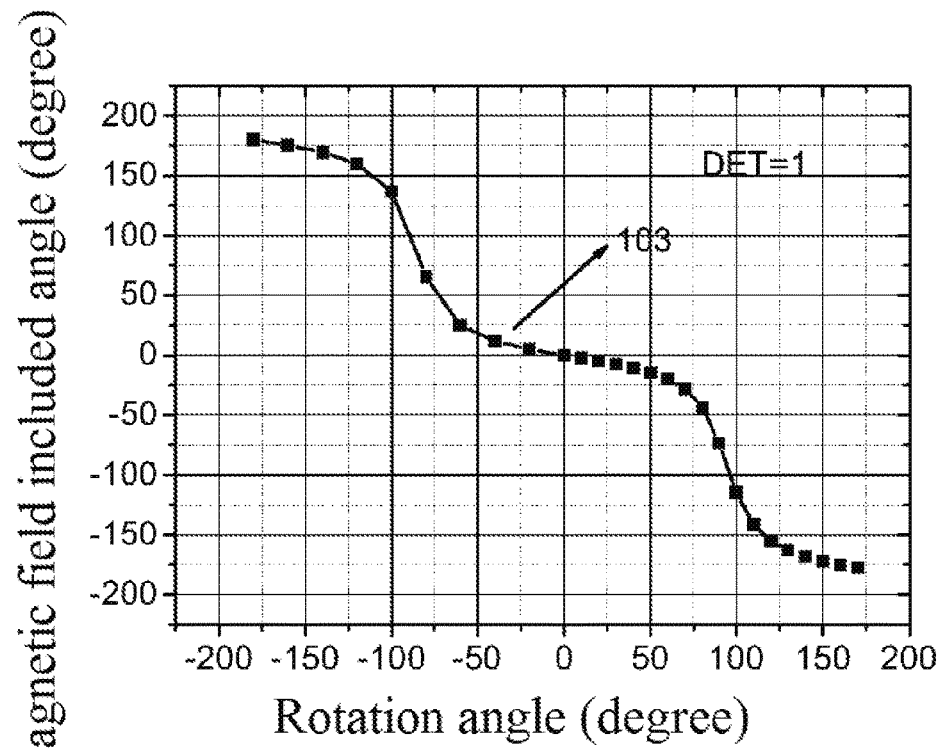
FIG. 31 is a typical relation diagram of an average magnetic field measuring angle and a rotation angle of the permanent magnet encoding disc in the second structure of the single-chip Z-X magnetoresistive angle sensor.
Figure 32:
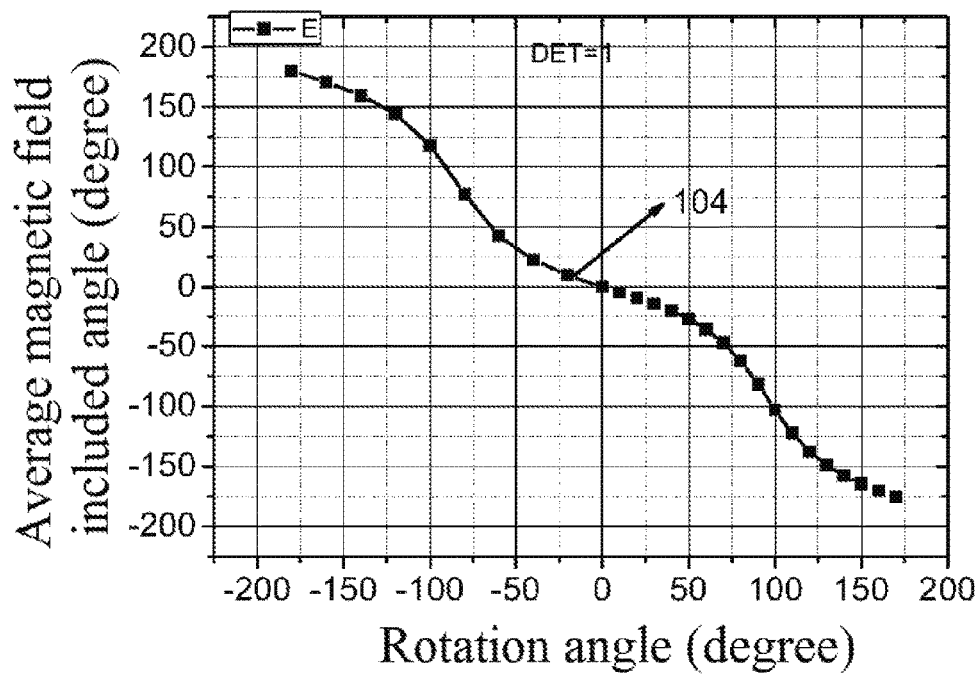
FIG. 32 is a typical relation diagram of an average magnetic field measuring angle and a rotation angle of the permanent magnet encoding disc in the third structure of the single-chip Z-X magnetoresistive angle sensor.

A change relation of φ with θ is correlated with the distance Det between the single-chip off-axis magnetoresistive Z-X angle sensor 101 and the permanent magnet encoding disc 100 and the Space between adjacent Z-axis magnetoresistive sensors and subunits thereof as well as X-axis magnetoresistive sensors and subunits thereof, and only when the change relation of φ with θ is a linear relation, can the Z-X magnetoresistive sensor chip 101 measure the rotation angle of the permanent magnet encoding disc 100; therefore, when it is necessary to determine that the single-chip off-axis magnetoresistive Z-X angle sensor 101 changes with the Space and the Det, interval ranges of the Space and the Det are required, so that the chip has the optimal angular measurement performance FIGS. 30-32 are relation diagrams of an average magnetic field included angle φ and a rotation angle θ of the permanent magnet encoding disc 100 corresponding to the single-chip off-axis magnetoresistive Z-X sensor 101, wherein the radius of the circular permanent magnet encoding disc 100 is r=8 mm, when Det=1 mm, it can be seen that a relation curve 102 of the single-chip off-axis magnetoresistive Z-X angle sensor of the type of the first structure corresponding to FIG. 30 has typical linear features, while a relation curve 103 of the single-chip off-axis magnetoresistive Z-X angle sensor of the type of the second structure corresponding to FIG. 31 has nonlinear features, and fluctuation amplitude thereof is evidently greater than that of the angle relation curve of the Z-X magnetoresistive angle sensor 104 of the type of the third structure corresponding to FIG. 32.

Figure 33:
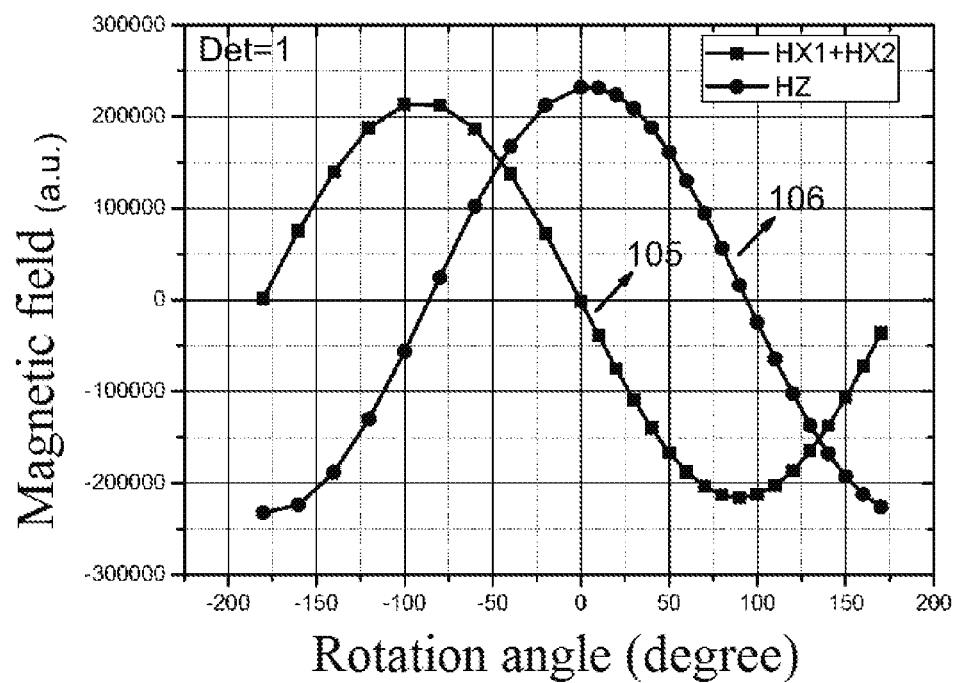
FIG. 33 is a diagram of magnetic field measuring signals of the Z-axis and X-axis magnetoresistive sensors in the first structure of the single-chip Z-X magnetoresistive angle sensor.
Figure 34:
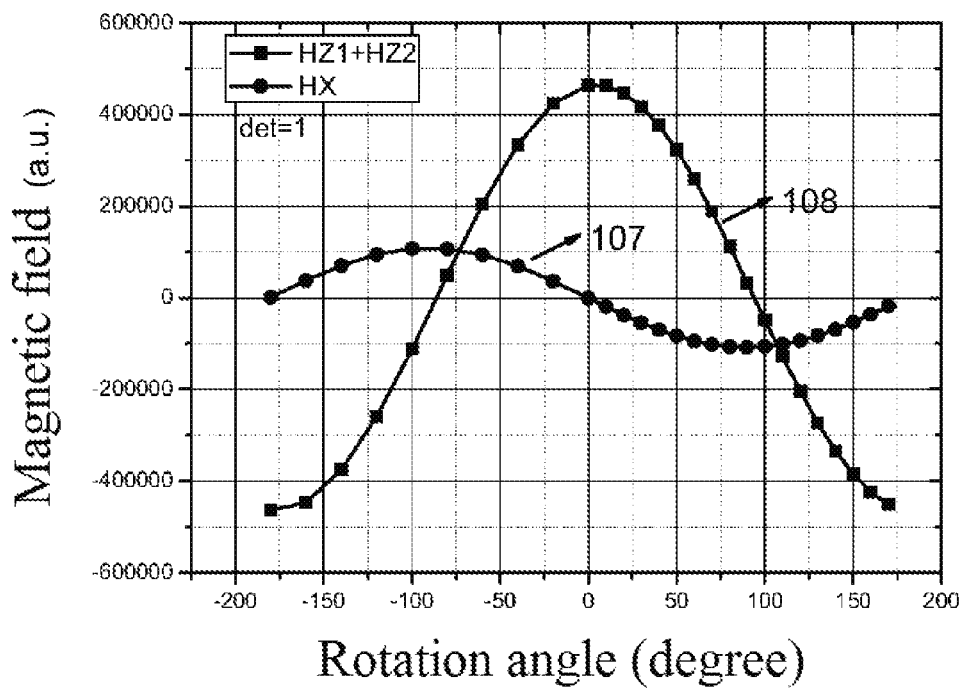
FIG. 34 is a diagram of magnetic field measuring signals of the Z-axis and X-axis magnetoresistive sensors in the second structure of the single-chip Z-X magnetoresistive angle sensor.
Figure 35:
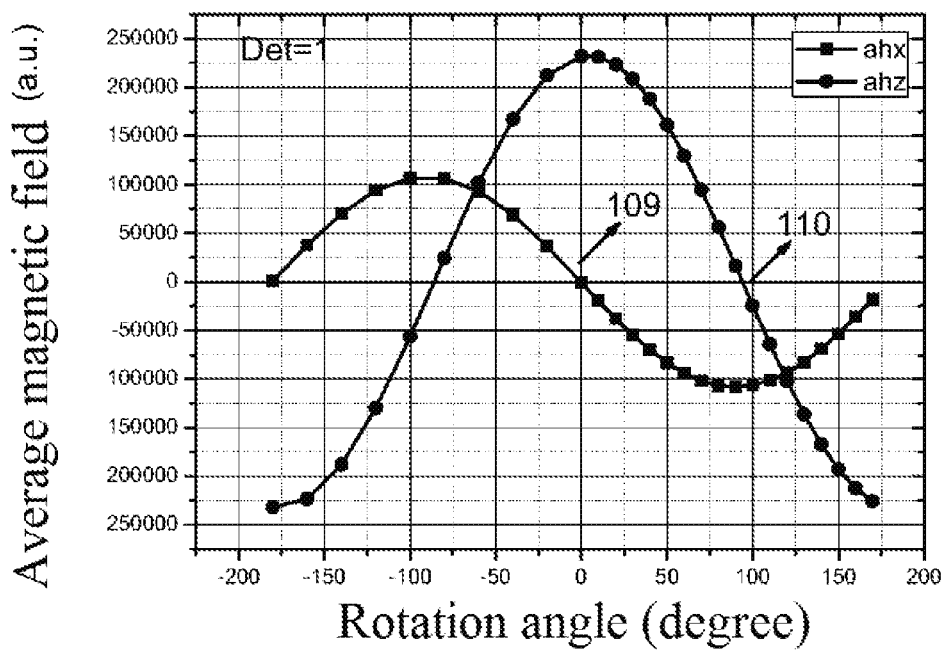
FIG. 35 is a diagram of magnetic field measuring signals of the Z-axis and X-axis magnetoresistive sensors in the third structure of the single-chip Z-X magnetoresistive angle sensor.

FIGS. 33-35 are typical relation curve diagrams of measuring magnetic fields of the Z and X magnetoresistive sensors corresponding to the single-chip off-axis magnetoresistive Z-X angle sensor chip 101 of the three types with the rotation angle of the circular permanent magnet encoding disc, from which it can be seen that, in the three structures, curves 105, 107, 109 and 106, 108, 110 of the measuring magnetic fields of the Z-axis and X-axis magnetoresistive sensors vs. the rotation angles are all sine and cosine curves, and a phase difference between them is 90 degrees.

Figure 36:
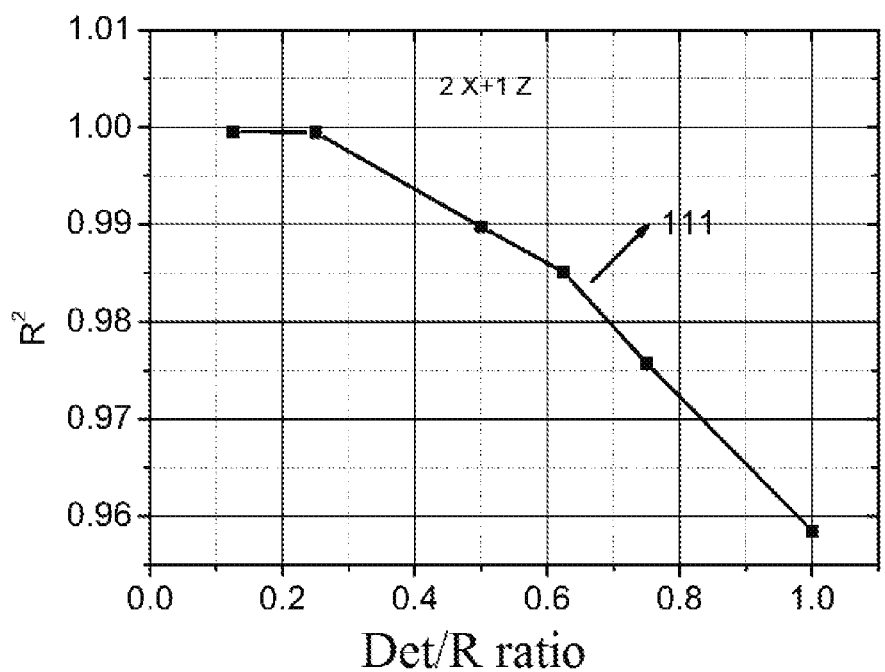
FIG. 36 is a relation diagram of a linear fitted curve R2 of the average magnetic field measuring angle and the rotation angle of the permanent magnet encoding disc in the first structure of the single-chip Z-X magnetoresistive sensor vs. a distance of a chip away from the edge of the encoding disc.
Figure 37:
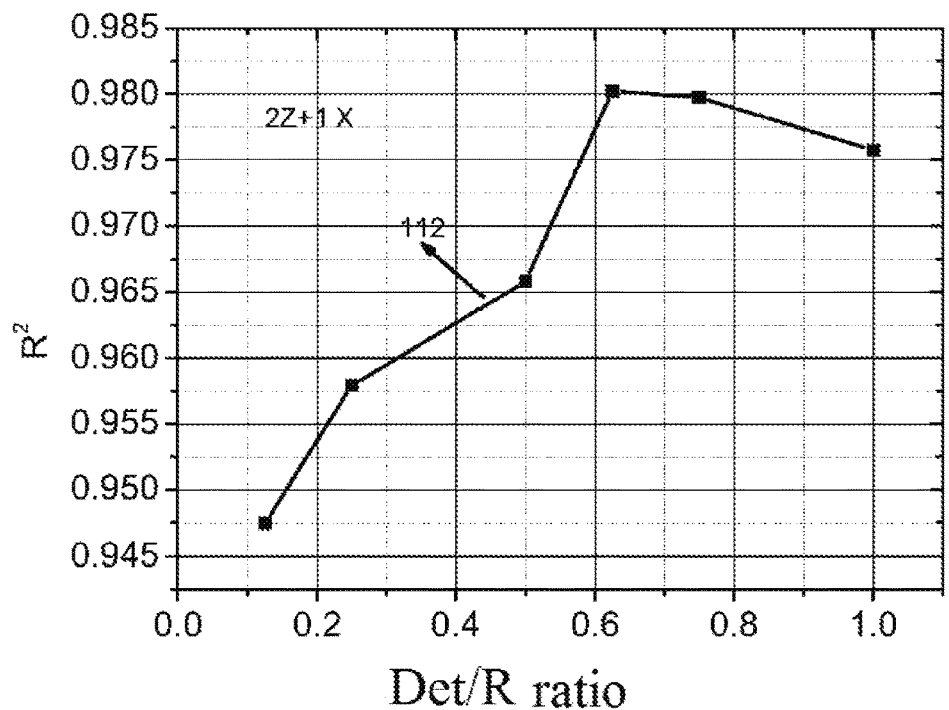
FIG. 37 is a relation diagram of a linear fitted curve R2 of the average magnetic field measuring angle and the rotation angle of the permanent magnet encoding disc in the second structure of the single-chip Z-X magnetoresistive sensor vs. a distance of a chip away from the edge of the encoding disc.
Figure 38:
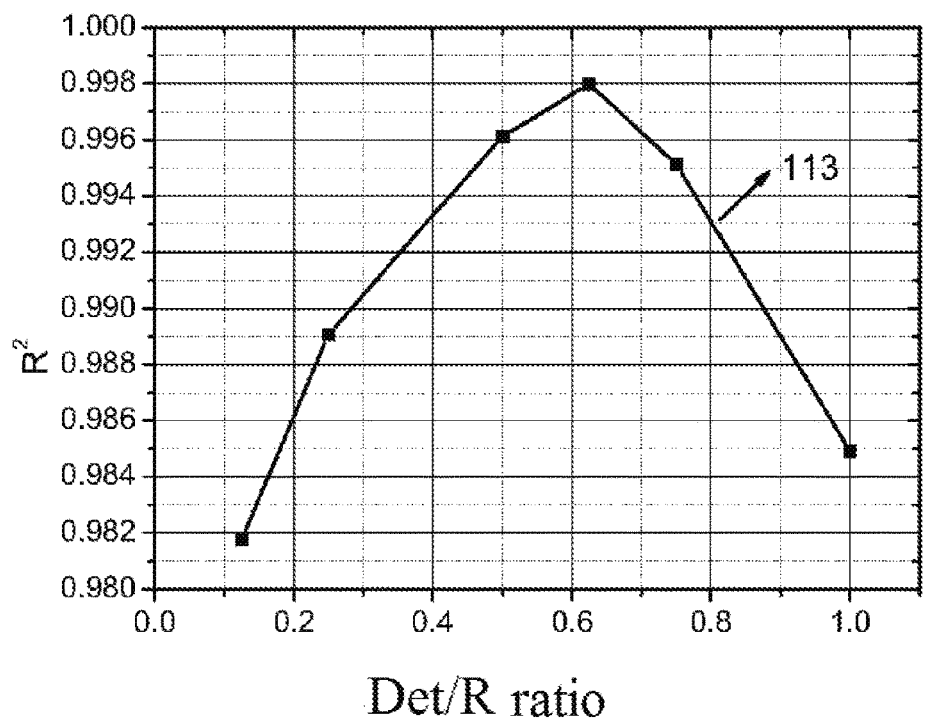
FIG. 38 is a relation diagram of a linear fitted curve R2 of the average magnetic field measuring angle and the rotation angle of the permanent magnet encoding disc in the third to fifth structures of the single-chip Z-X magnetoresistive sensor vs. a distance of a chip away from the edge of the encoding disc.

FIGS. 36-38 are relation diagrams of a linear fitted feature parameter R2 of the magnetic field angle relation of the single-chip off-axis magnetoresistive Z-X angle sensor of the three structures vs. a Det/r ratio, respectively. It can be seen that the R2 curve 111 of the first structure corresponding to FIG. 36 gradually attenuates with increase of the Det/r ratio, when Det=0-0.3 r, the linearity is the best; the R2 curve 112 of the second structure corresponding to FIG. 37 gradually increases with increase of the Det/r, reaches the maximum when Det=0.6-0.8 r, and then begins to decrease; and the R2 curve 113 of the third structure corresponding to FIG. 38 increases with Det and reaches the maximum when the Det is near 0.6 r.

Figure 39:
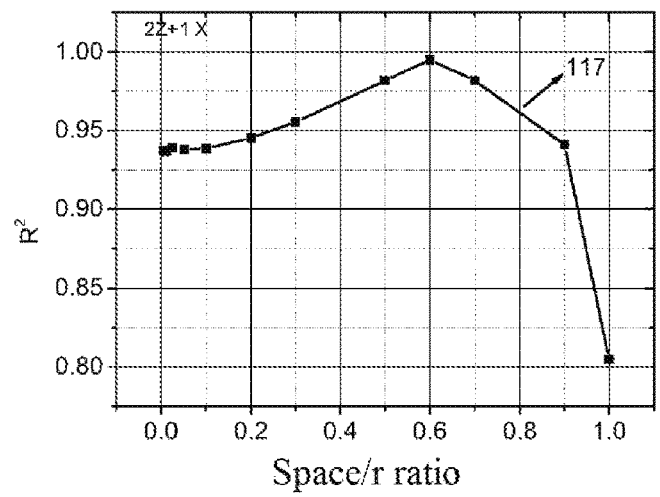
FIG. 39 is a relation diagram of a linear fitted curve R2 of the average magnetic field measuring angle and the rotation angle of the permanent magnet encoding disc in the first structure of the single-chip Z-X magnetoresistive sensor vs. a span between a chip and the X-axis and Z-axis magnetoresistive sensors.
Figure 40:
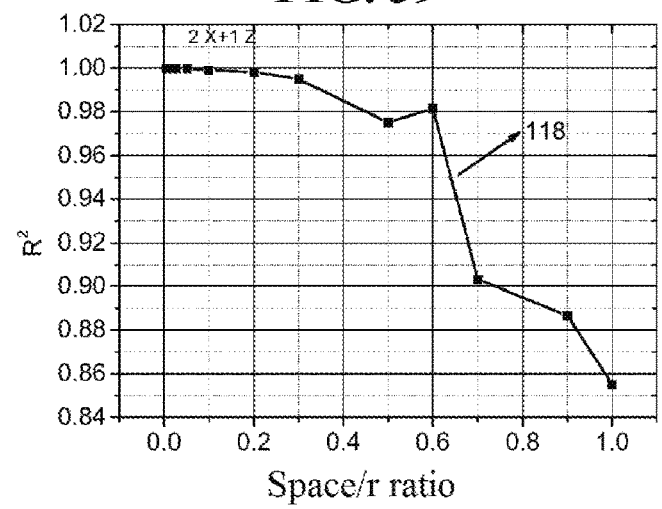
FIG. 40 is a relation diagram of a linear fitted curve R2 of the average magnetic field measuring angle and the rotation angle of the permanent magnet encoding disc in the second structure of the single-chip Z-X magnetoresistive sensor vs. a span between a chip and the X-axis and Z-axis magnetoresistive sensors.
Figure 41:
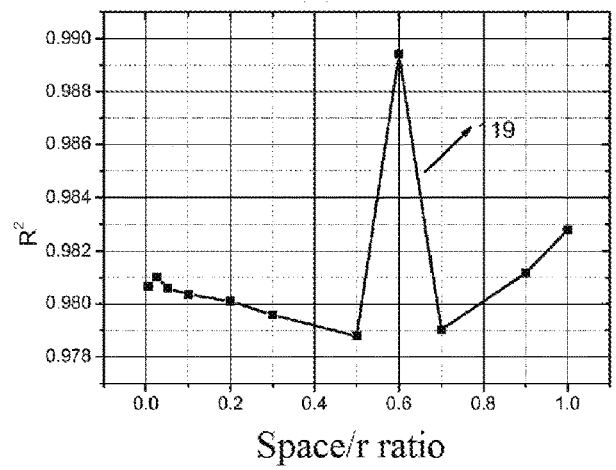
FIG. 41 is a relation diagram of a linear fitted curve R2 of the average magnetic field measuring angle and the rotation angle of the permanent magnet encoding disc in the third to fifth structures of the single-chip Z-X magnetoresistive sensor vs. a span between a chip and the X-axis and Z-axis magnetoresistive sensors.

FIGS. 39-41 are relation diagrams of a linear fitted parameter R2 of an angle relation curve of the single-chip off-axis magnetoresistive Z-X angle sensor vs. a Space/r ratio. FIG. 39 is a relation diagram of an R2 curve 117 corresponding to the first structure vs. the Space/r ratio, with increase of the Space, R2 gradually decreases, and it can be seen that the linear feature is the best at the span of 0-0.3 r. FIG. 40 is a relation diagram of an R2 curve 118 corresponding to the second structure vs. the Space/r ratio, with increase of the Space, R2 gradually increases, and it can be seen that the linear feature is the best at 0.5-0.7 r. An R2 curve 119 corresponding to the third structure corresponding to FIG. 41 has the best linear feature when near 0.6 r.

In addition, it can be seen from vertical comparison between the magnetoresistive Z-X angle sensor chips of the three types that the single-chip off-axis magnetoresistive Z-X angle sensor of the first type has the best performance feature.

The above descriptions are merely preferred embodiments of the present invention, and are not intended to limit the present invention. For those skilled in the art, the present invention may have various modifications and changes. Any modification, equivalent replacement, improvement and the like without departing from the spirit and principle of the present invention should all fall within the protection scope of the present invention.

The invention claimed is:

1. A single-chip off-axis magnetoresistive Z-X angle sensor, used for detecting a magnetic field rotation angle on a plane perpendicular to a substrate surface, wherein the Z-X angle sensor comprises:
a substrate located on an X-Y plane;
at least one X-axis magnetoresistive sensor located on the substrate, for detecting an X-axis magnetic field component parallel to the substrate surface; and
at least one Z-axis magnetoresistive sensor located on the substrate, for detecting a Z-axis magnetic field component perpendicular to the substrate surface;
wherein the X-axis magnetoresistive sensor and the Z-axis magnetoresistive sensor each comprise a magnetoresistive sensing unit and a flux concentrator, the flux concentrator is elongated with the major axis being parallel to a Y-axis direction and the minor axis being parallel to an X-axis direction, and a sensitive direction of the magnetoresistive sensing unit is parallel to the X-axis direction;
wherein the magnetoresistive sensing unit of the Z-axis magnetoresistive sensor and the magnetoresistive sensing unit of the X-axis magnetoresistive sensor are each electrically connected into a magnetoresistive bridge comprising at least two bridge arms, wherein each of the bridge arms is a two-port structure formed by one or more of the magnetoresistive sensing units through electrical connection, and the magnetoresistive sensing units in the bridge arm are arranged into a plurality of magnetoresistive unit columns along a direction parallel to a Y axis; and
wherein the magnetoresistive bridge of the Z-axis magnetoresistive sensor is a push-pull bridge, wherein a push arm and a pull arm are located on different sides of a Y-axis central line above or below the flux concentrator in the Z-axis magnetoresistive sensor, respectively, and equidistant from the Y-axis central line corresponding thereto; the magnetoresistive bridge of the X-axis magnetoresistive sensor is a reference bridge, wherein a reference arm is located at a position on a Y-axis central line above or below the flux concentrator in the X-axis magnetoresistive sensor, and a sensitive arm is located at a position more than half of the width of the flux concentrator away from the Y-axis central line above or below the flux concentrator in the X-axis magnetoresistive sensor.

2. The single-chip off-axis magnetoresistive Z-X angle sensor according to claim 1, wherein the flux concentrator is a soft magnetic alloy material containing one or more elements of Ni, Fe, and Co.

3. The single-chip off-axis magnetoresistive Z-X angle sensor according to claim 1, wherein the magnetoresistive sensing unit is a GMR or TMR magnetoresistive sensing unit.

4. The single-chip off-axis magnetoresistive Z-X angle sensor according to claim 1, wherein the Z-axis magnetoresistive sensor comprises two Z-axis magnetoresistive sensor subunits which are located on two sides of the X-axis magnetoresistive sensor along the X-axis direction, respectively, and the Z-axis magnetoresistive sensor and the X-axis magnetoresistive sensor are corresponding to different flux concentrators, respectively.

5. The single-chip off-axis magnetoresistive Z-X angle sensor according to claim 1, wherein the X-axis magnetoresistive sensor comprises two X-axis magnetoresistive sensor subunits which are located on two sides of the Z-axis magnetoresistive sensor along the X-axis direction, respectively, and the Z-axis magnetoresistive sensor and the X-axis magnetoresistive sensor are corresponding to different flux concentrators, respectively.

6. The single-chip off-axis magnetoresistive Z-X angle sensor according to claim 1, wherein the X-axis and Z-axis magnetoresistive sensors respectively comprise a plurality of X-axis magnetoresistive sensor subunits and a plurality of Z-axis magnetoresistive sensor subunits, the X-axis magnetoresistive sensor subunits and the Z-axis magnetoresistive sensor subunits being alternately arranged along the X-axis direction, and the Z-axis magnetoresistive sensor and the X-axis magnetoresistive sensor are corresponding to different flux concentrators, respectively.

7. The single-chip off-axis magnetoresistive Z-X angle sensor according to claim 1, wherein the Z-axis magnetoresistive sensor and the X-axis magnetoresistive sensor are arranged along the Y-axis direction, and the Z-axis magnetoresistive sensor and the X-axis magnetoresistive sensor are corresponding to different flux concentrators, respectively.

8. The single-chip off-axis magnetoresistive Z-X angle sensor according to claim 1, wherein the magnetoresistive sensing unit of the Z-axis magnetoresistive sensor and the magnetoresistive sensing unit of the X-axis magnetoresistive sensor are mixedly arranged along the X-axis direction, and the Z-axis magnetoresistive sensor and the X-axis magnetoresistive sensor have a common flux concentrator.

9. The single-chip off-axis magnetoresistive Z-X angle sensor according to claim 4, wherein the Z-axis magnetoresistive sensor or the Z-axis magnetoresistive sensor subunit comprises one flux concentrator, and the magnetoresistive sensing unit is corresponding to the one flux concentrator.

10. The single-chip off-axis magnetoresistive Z-X angle sensor according to claim 4, wherein the Z-axis magnetoresistive sensor or the Z-axis magnetoresistive sensor subunit comprises two flux concentrators, and the push arm and the pull arm are located at positions on different sides of Y-axis central lines of the two flux concentrators, respectively.

11. The single-chip off-axis magnetoresistive Z-X angle sensor according to claim 4, wherein the Z-axis magnetoresistive sensor or the Z-axis magnetoresistive sensor subunit comprises N+2 flux concentrators, and the magnetoresistive sensing unit is corresponding to N flux concentrators in the middle, wherein the N is a positive integer.

12. The single-chip off-axis magnetoresistive Z-X angle sensor according to claim 4, wherein the X-axis magnetoresistive sensor or the X-axis magnetoresistive sensor subunit comprises 2N magnetoresistive unit columns, and a space between two adjacent flux concentrators in the X-axis magnetoresistive sensor is L; when the number of the flux concentrators of the X-axis magnetoresistive sensor is 2N−2, two magnetoresistive unit columns in the middle of the X-axis magnetoresistive sensor are adjacent to each other and corresponding to the reference arm, and a space therebetween is 2L; when the number of the flux concentrators of the X-axis magnetoresistive sensor is 2N−1, two magnetoresistive unit columns in the middle of the X-axis magnetoresistive sensor are corresponding to the sensitive arm and a space therebetween is 2L, wherein the L is a natural number, and the N is an integer greater than 1.

13. The single-chip off-axis magnetoresistive Z-X angle sensor according to claim 4, wherein the X-axis magnetoresistive sensor or the X-axis magnetoresistive sensor subunit comprises 2N magnetoresistive unit columns and 2N−1 flux concentrators, and the magnetoresistive unit columns of the X-axis magnetoresistive sensor are alternately distributed above or below the flux concentrators of the X-axis magnetoresistive sensor and at positions more than half of the width of the flux concentrators of the X-axis magnetoresistive sensor away from the Y-axis central line, wherein the N is a positive integer.

14. The single-chip off-axis magnetoresistive Z-X angle sensor according to claim 8, wherein, when the number of the flux concentrators is 2N+2, the Z-axis magnetoresistive sensor comprises 4N magnetoresistive unit columns which are corresponding to 2N flux concentrators in the middle, the X-axis magnetoresistive sensor comprises 2N+2 magnetoresistive unit columns, a distance between two magnetoresistive unit columns in the middle of the X-axis magnetoresistive sensor is 4L, and a distance between two adjacent flux concentrators is L, wherein the L is a natural number, and the N is an integer greater than 1.

15. The single-chip off-axis magnetoresistive Z-X angle sensor according to claim 8, wherein the number of the flux concentrators is 2N+2, the Z-axis magnetoresistive sensor comprises 4N magnetoresistive unit columns which are corresponding to 2N flux concentrators in the middle, respectively, the number of the magnetoresistive unit columns comprised in the X-axis magnetoresistive sensor is 4N, a distance between two magnetoresistive unit columns in the middle of the X-axis magnetoresistive sensor is 2L, and a distance between two adjacent flux concentrators is L, wherein the L is a natural number, and the N is an integer greater than 1.

16. The single-chip off-axis magnetoresistive Z-X angle sensor according to claim 8, wherein the number of the flux concentrators is N, the number of the magnetoresistive unit columns comprised in the Z-axis magnetoresistive sensor is 2(N−2) which are corresponding to N−2 flux concentrators in the middle, the number of the magnetoresistive unit columns comprised in the X-axis magnetoresistive sensor is 2(N−1), and a magnetoresistive unit column is distributed on a Y-axis central line of one of the flux concentrators on one side thereof, wherein the N is an integer greater than 3.

17. The single-chip off-axis magnetoresistive Z-X angle sensor according to claim 1, wherein the numbers of the magnetoresistive unit columns corresponding to the reference arm and the sensitive arm in the X-axis magnetoresistive sensor are the same, and the numbers of the magnetoresistive unit columns corresponding to the push arm and the pull arm in the Z-axis magnetoresistive sensor are the same.

18. The single-chip off-axis magnetoresistive Z-X angle sensor according to claim 8, wherein the flux concentrators corresponding to the Z-axis magnetoresistive sensor and the X-axis magnetoresistive sensor have the same width, and also have the same thickness.

19. The single-chip off-axis magnetoresistive Z-X angle sensor according to claim 1, wherein a magnetic field gain coefficient at a position of a magnetoresistive unit column at a gap between the flux concentrators of the X-axis magnetoresistive sensor is 1<Asns<100, and a magnetic field attenuation coefficient at a position of a magnetoresistive unit column at the Y-axis central line above or below the flux concentrator of the X-axis magnetoresistive sensor is 0<Aref<1.

20. The single-chip off-axis magnetoresistive Z-X angle sensor according to claim 1, wherein a space L between two adjacent flux concentrators in the Z-axis magnetoresistive sensor is not less than a width Lx of the flux concentrator of the Z-axis magnetoresistive sensor.

21. The single-chip off-axis magnetoresistive Z-X angle sensor according to claim 1, wherein a space between two adjacent flux concentrators in the Z-axis magnetoresistive sensor is L>2Lx, wherein the Lx is the width of the flux concentrator in the Z-axis magnetoresistive sensor.

22. The single-chip off-axis magnetoresistive Z-X angle sensor according to claim 1, wherein, for the Z-axis magnetoresistive sensor, the smaller a space between the magnetoresistive unit column thereon and an upper edge or a lower edge of the flux concentrator is, or the greater the thickness Lz of the flux concentrator thereon is, or the smaller the width Lx of the flux concentrator thereon is, the higher the sensitivity of the Z-axis magnetoresistive sensor is.

23. The single-chip off-axis magnetoresistive Z-X angle sensor according to claim 1, wherein the reference bridge of the X-axis magnetoresistive sensor and/or the push-pull bridge of the Z-axis magnetoresistive sensor are/is one of a half bridge structure, a full bridge structure, and a quasi-bridge structure.

24. The single-chip off-axis magnetoresistive Z-X angle sensor according to claim 1, wherein the magnetoresistive sensing units of the X-axis magnetoresistive sensor and the Z-axis magnetoresistive sensor both have the same magnetic field sensitivity.

25. An off-axis magnetoresistive Z-X angle measuring instrument, comprising the single-chip off-axis magnetoresistive Z-X angle sensor according to claim 1, wherein the off-axis magnetoresistive Z-X angle measuring instrument further comprises a circular permanent magnet encoding disc, a magnetization direction of the circular permanent magnet encoding disc is parallel to a straight line located in a rotation plane of the circular permanent magnet encoding disc and passing through the circle center of the circular permanent magnet encoding disc, a width direction and a rotation axis direction of the circular permanent magnet encoding disc are both along the Y-axis direction, the rotation plane is an X-Z plane, a distance from the X-Y plane where the substrate is located to the edge of the circular permanent magnet encoding disc is Det, and a Z axis passes through the center of the single-chip off-axis Z-X magnetoresistive angle sensor and the axis of the circular permanent magnet encoding disc, wherein the Det>0.

26. The off-axis magnetoresistive Z-X angle measuring instrument according to claim 25, wherein the Z-axis magnetoresistive sensor comprises two Z-axis magnetoresistive sensor subunits which are located on two sides of the X-axis magnetoresistive sensor along the X-axis direction, respectively, the Z-axis magnetoresistive sensor and the X-axis magnetoresistive sensor are corresponding to different flux concentrators, respectively, the Det is 0.2-0.3 r, and a space between the X-axis magnetoresistive sensor and the Z-axis magnetoresistive sensor subunits is 0-0.3 r, wherein r is the radius of the circular permanent magnet encoding disc.

27. The off-axis magnetoresistive Z-X angle measuring instrument according to claim 25, wherein the X-axis magnetoresistive sensor comprises two X-axis magnetoresistive sensor subunits which are located on two sides of the Z-axis magnetoresistive sensor along the X-axis direction, respectively, the Z-axis magnetoresistive sensor and the X-axis magnetoresistive sensor are corresponding to different flux concentrators, respectively, the Det is 0.6-0.8 r, and a space between the X-axis magnetoresistive sensor subunits and the Z-axis magnetoresistive sensor is 0.5-0.7 r, wherein r is the radius of the circular permanent magnet encoding disc.

28. The off-axis magnetoresistive Z-X angle measuring instrument according to claim 25, wherein the X-axis magnetoresistive sensor and the Z-axis magnetoresistive sensor comprise a plurality of X-axis magnetoresistive sensor subunits and a plurality of Z-axis magnetoresistive sensor subunits, respectively, the X-axis magnetoresistive sensor subunits and the Z-axis magnetoresistive sensor subunits being alternately arranged along the X-axis direction, the Z-axis magnetoresistive sensor and the X-axis magnetoresistive sensor are corresponding to different flux concentrators, respectively, the Det is 0.5-0.7 r, and a space between the Z-axis magnetoresistive sensor subunit and the X-axis magnetoresistive sensor subunit adjacent to each other is 0.6 r, wherein r is the radius of the circular permanent magnet encoding disc.

29. The off-axis magnetoresistive Z-X angle measuring instrument according to claim 25, wherein the Z-axis magnetoresistive sensor and the X-axis magnetoresistive sensor are arranged along the Y-axis direction, the Z-axis magnetoresistive sensor and the X-axis magnetoresistive sensor are corresponding to different flux concentrators, respectively, and the Det is 0.5-0.7 r, wherein r is the radius of the circular permanent magnet encoding disc.

30. The off-axis magnetoresistive Z-X angle measuring instrument according to claim 25, wherein the magnetoresistive sensing unit of the Z-axis magnetoresistive sensor and the magnetoresistive sensing unit of the X-axis magnetoresistive sensor are mixedly arranged along the X-axis direction, the Z-axis magnetoresistive sensor and the X-axis magnetoresistive sensor have a common flux concentrator, and the Det is 0.5-0.7 r, wherein r is the radius of the circular permanent magnet encoding disc.

31. The off-axis magnetoresistive Z-X angle measuring instrument according to claim 25, wherein the Z-axis magnetoresistive sensor and the X-axis magnetoresistive sensor are arranged along the Y-axis direction, the Z-axis magnetoresistive sensor and the X-axis magnetoresistive sensor have no common flux concentrator, and the single-chip off-axis magnetoresistive Z-X angle sensor is located in an X-axis and Z-axis magnetic field homogeneous region of the circular permanent magnet encoding disc along the width direction of the circular permanent magnet encoding disc.

* * * * *